United States Patent
Ohmi et al.

(10) Patent No.: US 6,744,802 B1
(45) Date of Patent: Jun. 1, 2004

(54) LASER OSCILLATING APPARATUS WITH SLOTTED WAVEGUIDE

(75) Inventors: Tadahiro Ohmi, 1-17-301, Komegafukuro 2-chome, Aoba-ku, Sendai-shi, Miyagi-ken (JP); Nobumasa Suzuki, Utsunomiya (JP); Hiroshi Ohsawa, Utsunomiya (JP); Nobuyoshi Tanaka, Tokyo (JP); Toshikuni Shinohara, Sendai (JP); Masaki Hirayama, Sendai (JP)

(73) Assignees: Canon Kabushiki Kaisha, Tokyo (JP); Tadahiro Ohmi, Sendai (JP)

( * ) Notice: Subject to any disclaimer, the term of this patent is extended or adjusted under 35 U.S.C. 154(b) by 0 days.

(21) Appl. No.: 09/512,074

(22) Filed: Feb. 24, 2000

(30) Foreign Application Priority Data

Feb. 26, 1999 (JP) ............................. 11-051810
Feb. 26, 1999 (JP) ............................. 11-051811
Jan. 7, 2000 (JP) ........................... 2000-001979

(51) Int. Cl.[7] ................................. H01S 3/097
(52) U.S. Cl. ..................... 372/82; 372/55; 372/64
(58) Field of Search ..................... 372/55, 57, 61, 372/64, 82, 83; 250/492.1

(56) References Cited

U.S. PATENT DOCUMENTS

| 4,884,282 | A | * | 11/1989 | Bridges | 372/97 |
|---|---|---|---|---|---|
| 5,050,181 | A | * | 9/1991 | Gekat | 372/69 |
| 5,171,965 | A | * | 12/1992 | Suzuki et al. | 219/121.6 |
| 5,224,117 | A | * | 6/1993 | Kruger et al. | 372/82 |
| 5,255,282 | A | * | 10/1993 | Remo | 372/82 |
| 5,517,608 | A | | 5/1996 | Suzuki et al. | |
| 5,698,036 | A | * | 12/1997 | Ishii et al. | 118/723 |
| 5,985,091 | A | * | 11/1999 | Suzuki | 156/345 |
| 6,204,606 | B1 | * | 3/2001 | Spence et al. | 315/111.21 |

FOREIGN PATENT DOCUMENTS

| DE | 263 648 | 1/1989 |
|---|---|---|
| EP | 0 820 132 | 1/1998 |

* cited by examiner

*Primary Examiner*—David Porta
*Assistant Examiner*—Davienne Monbleau
(74) *Attorney, Agent, or Firm*—Fitzpatrick, Cella, Harper & Scinto

(57) ABSTRACT

In a slot array structure, electromagnetic wave emission which is uniform as a whole over the length of a laser tube is realized to allow uniform laser emission with minimum energy loss. Slots (10) are formed at a predetermined pitch in a long end face (H plane) of each waveguide (1) along a central line (m) in the longitudinal direction of the H plane to be alternately located on the left and right sides of the central line (m) and spaced apart from the central line (m) by a distance (d).

30 Claims, 22 Drawing Sheets

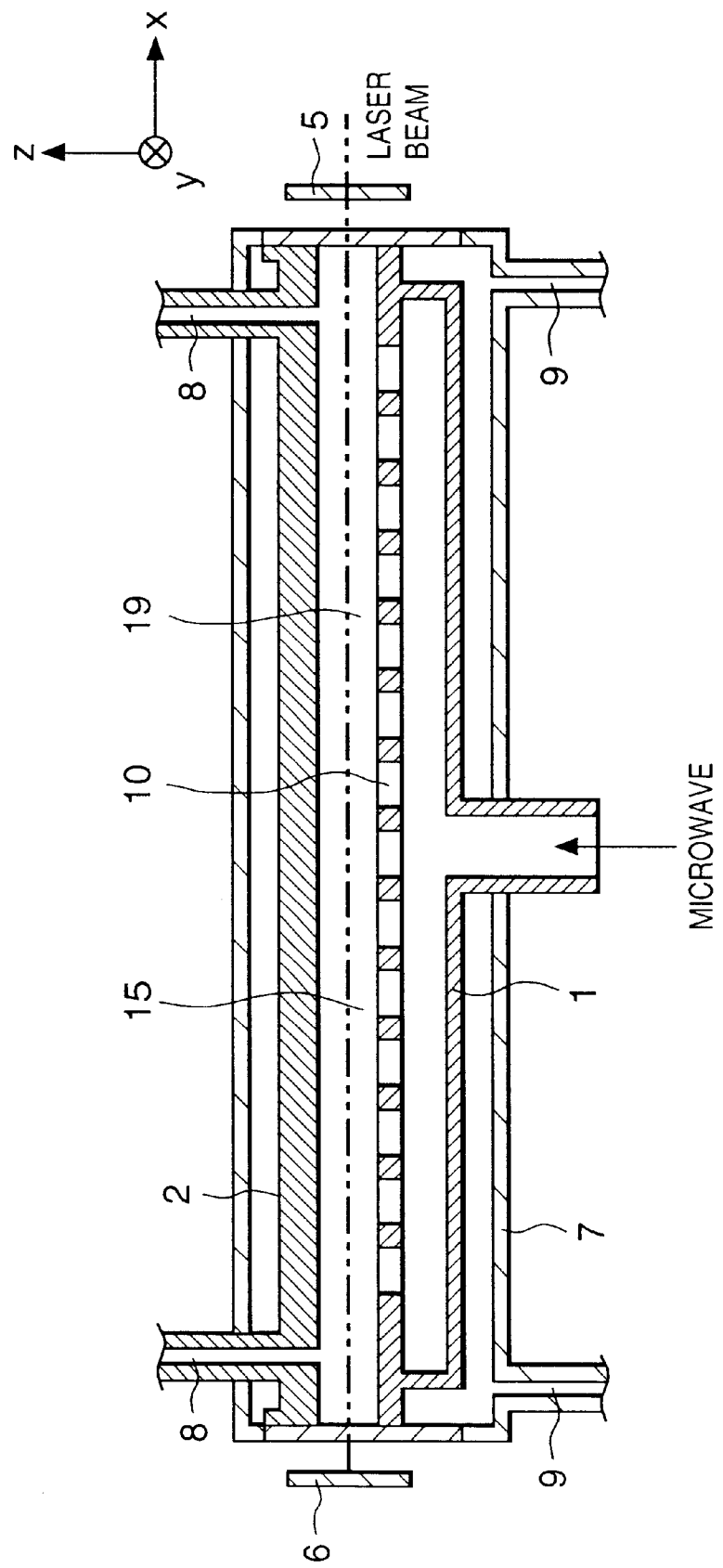

MULTI-SLIT TYPE

SINGLE-SLIT TYPE

FIG. 5
SINGLE-MULTI-SLIT TYPE
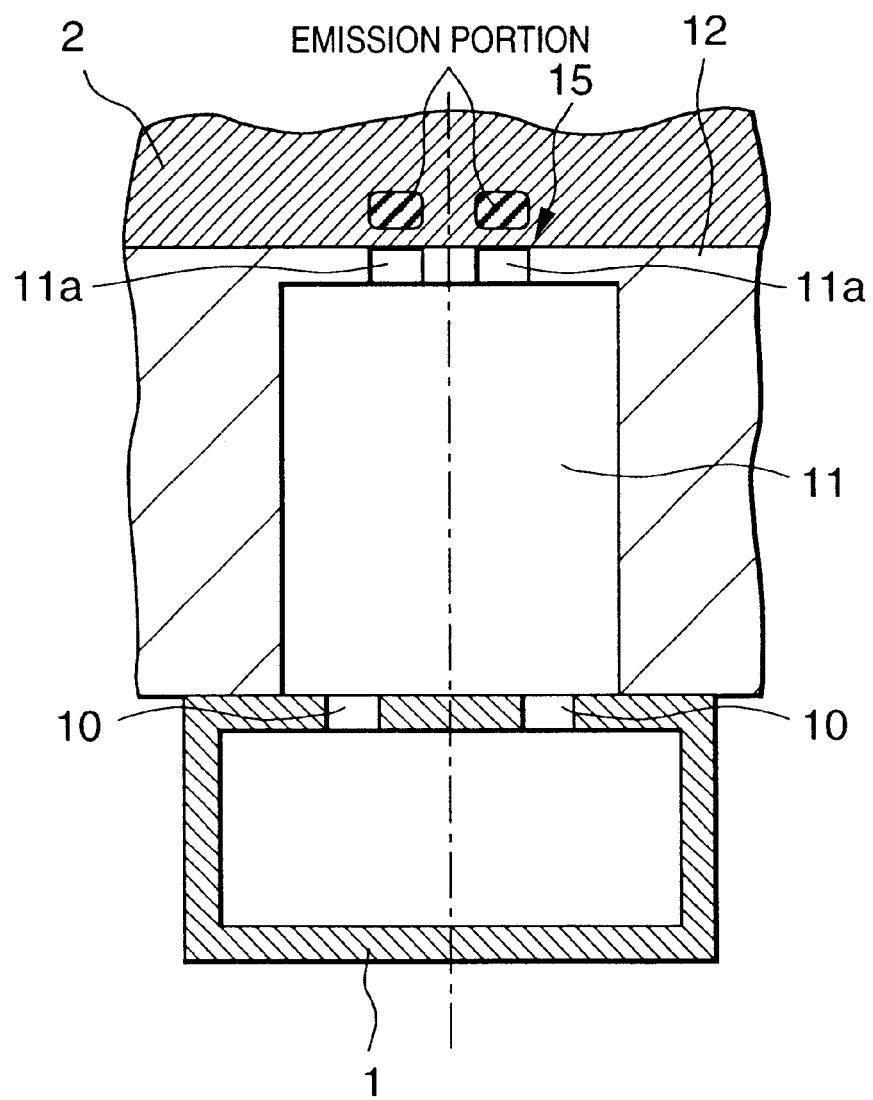
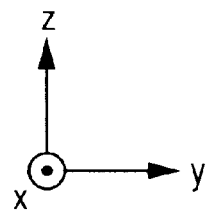

SINGLE-MULTI-SLIT OPPOSING TYPE

EXAMPLE OF H-PLANE ANTENNA

SHAPE OF SLOT DIELECTRIC SUBSTANCE

SHAPE OF SLOT DIELECTRIC SUBSTANCE

SHAPE OF SLOT DIELECTRIC SUBSTANCE

RELATIVE POSITION TO NORMAL WAVEGUIDE END [λg]

LASER OSCILLATING APPARATUS WITH SLOTTED WAVEGUIDE

FIELD OF THE INVENTION

The present invention relates to a laser oscillating apparatus for generating a laser beam by introducing an electromagnetic wave from a waveguide into a laser tube through a plurality of fine slots formed in the waveguide wall and, for example, to a laser oscillating apparatus using a microwave as an electromagnetic wave for exciting a laser gas, an exposure apparatus using the same, and a device fabrication method using the same.

BACKGROUND OF THE INVENTION

Recently, a so-called excimer laser has attracted attention as the only high-output laser which oscillates in the ultraviolet region. This excimer laser is expected to be applied to the electronic, chemical, and energy industries, particularly processing and chemical reactions of metals, resins, glass, ceramics, and semiconductors.

The principle of function of an excimer laser oscillator will be described below. First, laser gases such as Ar, Kr, Ne, $F_2$, He, Xe, and $Cl_2$ contained in a laser tube are excited by electron beam irradiation or discharge. Excited F atoms bond to inert Kr and Ar atoms in the ground state to generate $KrF^+$ and $ArF^+$ as molecules existing only in an excited state. These molecules are called excimers. Since excimers are unstable, they immediately emit ultraviolet rays and fall to the ground state. This phenomenon is called spontaneous emission. An excimer laser oscillator uses this to amplify as an in-phase beam in an optical resonator constructed of a pair of reflecting mirrors and extract as a laser beam.

In the case of excimer laser emission, microwaves are mainly used as a laser gas exciting source. Microwaves are electromagnetic waves having an oscillation frequency of a few hundred MHz to several tens of GHz. In this case, a microwave is introduced from a waveguide into a laser tube through a slot formed in the waveguide wall, thereby exciting a laser gas in the laser tube into a plasma.

Even if the intensity distribution of microwaves emitted through the slots is uniform, a slot array structure in which a plurality of slots are arrayed in the long-axis direction of a resonator must be formed in order to supply a microwave to a long space meeting the resonator length of a laser beam. This structure is shown in FIG. 22. Referring to FIG. 22, a plurality of fine slots 302 are formed at equal intervals in a waveguide wall 301. For convenience, the interior of a laser tube is schematically shown as an emission space.

When this slot array structure is used, regions (hatched elliptic regions in FIG. 22) between adjacent slots 302 are necessarily microwave non-irradiation regions. Accordingly, when a laser gas existing in the emission space is to be excited by a microwave, the existence of these non-irradiation regions produces variations in the microwave intensity. This generates plasma discharge having a nonuniform distribution as a whole.

SUMMARY OF THE INVENTION

The present invention has been made in consideration of the above problem, and has as its object to realize, for example, almost uniform electromagnetic wave radiation as a whole over the length of a laser tube in a slot array structure, thereby allowing almost uniform laser emission with minimum energy loss.

A laser oscillating apparatus according to the first aspect of the present invention comprises a waveguide in which a plurality of slots are formed and a laser tube to excite a laser gas in the laser tube by supplying an electromagnetic wave from the waveguide into the laser tube through the slot and generate a laser beam by resonating light generated by excitation of the laser gas, wherein electromagnetic waves with in-phase electric fields are supplied to the laser tube through the plurality of slots.

In the laser oscillating apparatus according to the first aspect of the present invention, the plurality of slots may be formed in a long end face or short end face of the waveguide.

Preferably, in the laser oscillating apparatus, wherein the plurality of slots and the laser tube are spaced apart from each other by a predetermined distance, and the laser oscillating apparatus further comprises a passage for guiding electromagnetic waves from the plurality of slots to the laser tube. The distance between the plurality of slots and the laser tube is preferably an integral multiple of a half-wave length. It is preferable that the width of the passage be substantially equal to a width of the slot. Preferably, the width of the passage is an integral multiple of a half-wave length of an electromagnetic wave supplied from the wave guide to the laser tube. A portion through which the passage communicates with the laser tube preferably has one or a plurality of slit portions each having a predetermined width and extending over a length of the laser tube. For example, a portion through which the passage communicates with the waveguide preferably has a width larger than a width of a portion through which the passage communicates with the laser tube.

In the laser oscillating apparatus according to the first aspect of the present invention, the passage is preferably filled with a dielectric substance. The waveguide is preferably filled with a dielectric substance. The plurality of slots are filled with a dielectric substance. In this case, the plurality of slots are preferably filled with the dielectric substance such that a surface in which the plurality of slots are formed is flattened.

In the laser oscillating apparatus according to the first aspect of the present invention, the pair of waveguides are arranged to sandwich the laser tube.

The laser oscillating apparatus according to the first aspect of the present invention preferably further comprises, for example, an adjusting portion for adjusting an impedance of each of the plurality of slots. The adjusting portion preferably includes a minute metal member attached to the short end face of the waveguide.

According to the second aspect of the present invention, there is provided a laser oscillating apparatus which includes a waveguide in which a plurality of slots are formed and a laser tube to excite a laser gas in the laser tube by supplying an electromagnetic wave from the waveguide into the laser tube through the slot, and generate a laser beam by resonating light generated by excitation of the laser gas, wherein the plurality of slots are formed in a long end face of the waveguide, and the plurality of slots are arranged at a predetermined pitch along a central line in a longitudinal direction of the long end face to be alternately located on left and right sides of the central line and spaced apart from the central line by a predetermined distance.

In the laser oscillating apparatus according to the second aspect of the present invention, electromagnetic waves with in-phase electric fields are preferably supplied to the laser tube through the plurality of slots.

In the laser oscillating apparatus according to the second aspect of the present invention, the predetermined pitch is preferably determined such that electromagnetic waves with in-phase electric fields are supplied to the laser tube through the plurality of slots.

Preferably, in the laser oscillating apparatus according to the second aspect of the present invention, the plurality of slots and the laser tube are spaced apart from each other by a predetermined distance, and the laser oscillating apparatus further comprises a passage for guiding electromagnetic waves from the plurality of slots to the laser tube. The distance between the plurality of slots and the waveguide is preferably an integral multiple of a half-wave length. Preferably, the width of the passage is substantially equal to a width of the slot. The width of the passage is preferably an integral multiple of a half-wave length of an electromagnetic wave supplied from the waveguide to the laser tube. A portion through which the passage communicates with the laser tube preferably has, for example, one or a plurality of slit portions having a predetermined width and extending over a length of the laser tube. A portion through which the passage communicates with the waveguide preferably has a width larger than, for example, a width of a portion through which the passage communicates with the laser tube.

In the laser oscillating apparatus according to the second aspect of the present invention, the passage is preferably filled with a dielectric substance. The waveguide is preferably filled with a dielectric substance. The plurality of slots are preferably filled with a dielectric substance. The plurality of slots are preferably filled with the dielectric substance such that a surface in which the plurality of slots are formed is flattened.

In the laser oscillating apparatus according to the second aspect of the present invention, the pair of waveguides are preferably arranged to sandwich the laser tube.

Preferably, the laser oscillating apparatus according to the second aspect of the present invention further comprises an adjusting portion for adjusting an impedance of each of the plurality of slots. The adjusting portion preferably includes a minute metal member attached to the short end face of the waveguide.

According to the third aspect of the present invention, there is provided a laser oscillating apparatus for generating a laser beam by exciting a laser gas and resonating light generated by excitation of the laser gas, comprising a pair of waveguides in each of which a plurality of slots are formed, the pair of waveguides being arranged such that surfaces in each of which the plurality of slots are formed opposite to each other, and a laser tube placed between the pair of waveguides, wherein electromagnetic waves with in-phase electric fields are supplied to the laser tube through the plurality of slots formed in each of the pair of waveguides.

In the laser oscillating apparatus according to the third aspect of the present invention, the plurality of slots are preferably formed in a long end face of each of the pair of waveguides. The plurality of slots are preferably formed in two lines in each of the pair of waveguides.

In the laser oscillating apparatus according to the third aspect of the present invention, the plurality of slots are preferably formed in a short end face of each of the pair of waveguides. The plurality of slots are preferably formed in a line in each of the pair of waveguides.

In the laser oscillating apparatus according to the third aspect of the present invention, the plurality of slots formed in each of the pair of waveguides are preferably arranged such that electromagnetic waves with in-phase electric fields are supplied to the laser tube.

Preferably, in the laser oscillating apparatus according to the third aspect of the present invention, the plurality of slots are formed at a predetermined pitch in each of the pair of waveguides, a position of the plurality of slots formed in one waveguide in a longitudinal direction of the laser tube is shifted from a position of the plurality of slots formed in the other waveguide in the longitudinal direction of the laser tube by a predetermined distance.

Preferably, in the laser oscillating apparatus according to the third aspect of the present invention, the plurality of slots are formed at a predetermined pitch in, for example, each of the pair of waveguides, and the laser oscillating apparatus further comprises an electromagnetic wave supplying portion for supplying electromagnetic waves with a predetermined phase difference to each of the pair of waveguides.

Preferably, in the laser oscillating apparatus according to the third aspect of the present invention, the plurality of slots are formed at a predetermined pitch in each of the pair of waveguides, a position of the plurality of slots formed in one waveguide in a longitudinal direction of the laser tube is shifted from a position of the plurality of slots formed in the other waveguide in the longitudinal direction of the laser tube by a predetermined distance, and the laser oscillating apparatus further comprises an electromagnetic wave supply portion for supplying electromagnetic waves with a predetermined phase difference to each of the pair of waveguides, whereby electromagnetic waves with in-phase electric fields are supplied to the laser tube through the plurality of slots formed in each of the pair of waveguides.

Preferably, the laser oscillating apparatus according to the third aspect of the present invention further comprises a tuner for tuning electromagnetic waves to the pair of waveguides.

In the laser oscillating apparatuses according to the first to third aspects of the present invention, the electromagnetic wave supplied from the waveguide to the laser tube is preferably a microwave.

In the laser oscillating apparatuses according to the first to third aspects of the present invention, the laser gas is preferably one of at least one type of gas selected from the group consisting of Kr, Ar, and Ne, and a gas mixture of the one type of gas and $F_2$ gas, and the laser oscillating apparatus preferably comprises an excimer laser oscillating apparatus.

According to the fourth aspect of the present invention, there is provided an exposure apparatus comprising a laser oscillating unit, an illumination optical system for generating illuminating light for irradiating a mask by using illuminating light supplied from the laser oscillating unit, and a projection optical system for projecting a pattern of the mask illuminated with the illuminating light generated by the optical system onto a substrate, wherein the laser oscillating unit includes a waveguide in which a plurality of slots are formed and a laser tube to excite a laser gas in the laser tube by supplying an electromagnetic wave from the waveguide into the laser tube through the slot, and generate a laser beam by resonating light generated by excitation of the laser gas, and electromagnetic waves with in-phase electric fields are supplied to the laser tube through the plurality of slots.

According to the fifth aspect of the present invention, there is provided an exposure apparatus comprising a laser oscillating unit, an illumination optical system for generating illuminating light for irradiating a mask by using illuminating light supplied from the laser oscillating unit, and a projection optical system for projecting a pattern of the mask illuminated with the illuminating light generated by the optical system onto a substrate, wherein the laser oscillating unit includes a waveguide in which a plurality of slots are formed and a laser tube to excite a laser gas in the laser tube by supplying an electromagnetic wave from the waveguide into the laser tube through the slot, and generate a laser beam by resonating light generated by excitation of the laser gas, the plurality of slots are formed in a long end face of the waveguide, and the plurality of slots are arranged at a predetermined pitch along a central line in a longitudinal direction of the long end face to be alternately located on left and right sides of the central line and spaced apart the central line by a predetermined distance.

According to the sixth aspect of the present invention, there is provided an exposure apparatus comprising a laser oscillating unit, an illumination optical system for generating illuminating light for irradiating a mask by using illuminating light supplied from the laser oscillating unit, and a projection optical system for projecting a pattern of the mask illuminated with the illuminating light generated by the optical system onto a substrate, wherein the laser oscillating unit excites a laser gas and generates a laser beam by resonating light generated by excitation of the laser gas, the unit includes a plurality of slots formed in each of a pair of waveguides, and the pair of waveguide being arranged such that surfaces in which the plurality of slots are formed opposite to each other, and a laser tube placed between the pair of waveguides, and electromagnetic waves with in-phase electric fields are supplied to the laser tube through the plurality of slots formed in each of the pair of waveguides.

A device fabrication method according to the seventh aspect of the present invention comprises the steps of coating a substrate with a photosensitive material, exposing a pattern on the substrate coated with the photosensitive material by using any one of the exposure apparatuses described above, and developing the pattern on the exposed substrate.

Further objects, features and advantages of the present invention will become apparent from the following detailed description of embodiments of the present invention with reference to the accompanying drawings.

BRIEF DESCRIPTION OF THE DRAWINGS

FIG. 1 is a sectional view showing the main parts of an excimer laser oscillating apparatus according to the first embodiment of the present invention;

FIG. 5 is a schematic sectional view showing a portion near a waveguide in which a passage is formed by a metal wall in Modification 3 of the first embodiment;

DETAILED DESCRIPTION OF THE PREFERRED EMBODIMENTS

Figure 2A:
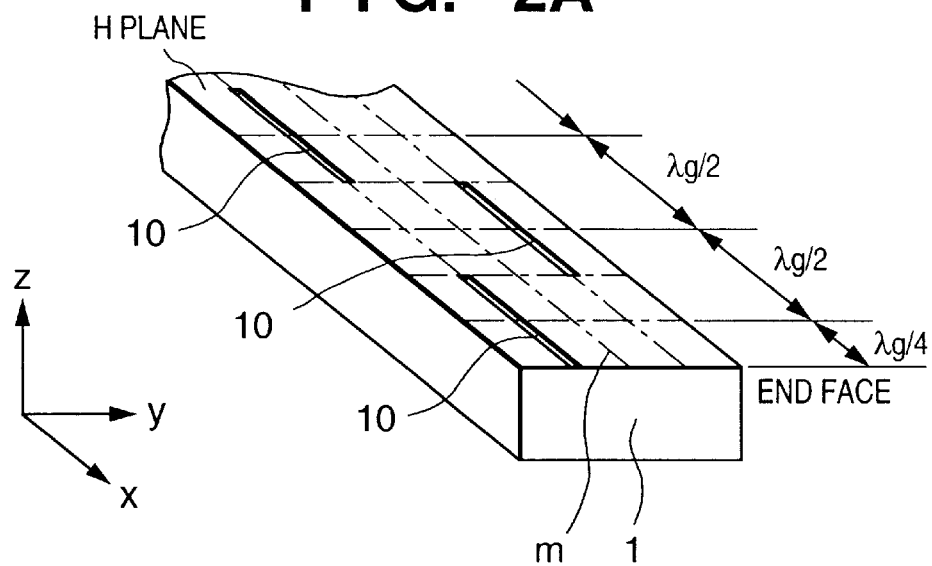
FIGS. 2A and 2B are views showing a waveguide having slots formed in its long end face (H plane)

Preferred embodiments of the present invention will now be described in detail in accordance with the accompanying drawings.

First Embodiment

The first embodiment will be described below. In this embodiment, an excimer laser oscillator which emits a so-called excimer laser beam will be explained.

FIG. 1 is a schematic view showing the main parts of the excimer laser oscillator of this embodiment. For the sake of convenience, slots 10 are drawn in a plane. In fact, however, the slots are alternately positioned in a direction perpendicular to the surface of the drawing (y direction).

As shown in FIG. 1, this excimer laser oscillator includes a laser tube 2, waveguide 1, and cooling vessel 7. The laser tube 2 emits a laser beam by resonating light emission due to excitation of an excimer laser gas. The waveguide 1 excites the excimer laser gas in the laser tube 2 to generate a plasma. The cooling vessel 7 has cooling water inlet/output ports 9 for cooling the waveguide 1.

The excimer laser gas as a material for generating an excimer laser beam is at least one inert gas selected from Kr, Ar, Ne, and He, or a gas mixture of at least one inert gas described above and $F^2$ gas. These gases can be appropriately selected and used in accordance with the wavelength of interest. For example, KrF is used when a laser beam with a wavelength of 248 nm is to be generated; ArF is used when a laser beam with a wavelength of 193 nm is to be generated; $F_2$ is used when a laser beam with a wavelength of 157 nm is to be generated; $Kr_2$ is used when a laser beam with a wavelength of 147 nm is to be generated; ArKr is used when a laser beam with a wavelength of 134 nm is to be generated; and $Ar_2$ is used when a laser beam with a wavelength of 126 nm is to be used.

The laser tube 2 has laser gas inlet/output ports 8 through which the excimer laser gas is introduced into the tube, and reflecting structures 5 and 6 at the two end portions. These reflecting structures 5 and 6 equalize the phases of light by plasma discharge and generate a laser beam.

The waveguide 1 is a means for supplying a microwave to the laser gas in a gas supply passage structure 19. A plurality of long and narrow slots 10 are formed in the waveguide 1. When a microwave with a frequency of a few hundred MHz to several tens of GHz is introduced from the lower portion of the waveguide 1, this microwave propagates in the waveguide 1 and is emitted from the slots 10 to the outside of the waveguide 1. The emitted microwave is introduced into the laser tube 2 through a window 15 formed in this laser tube 2. The microwave thus introduced excites the excimer laser gas in the laser tube 2, thereby generating an excimer laser beam by resonance.

Figure 2B:
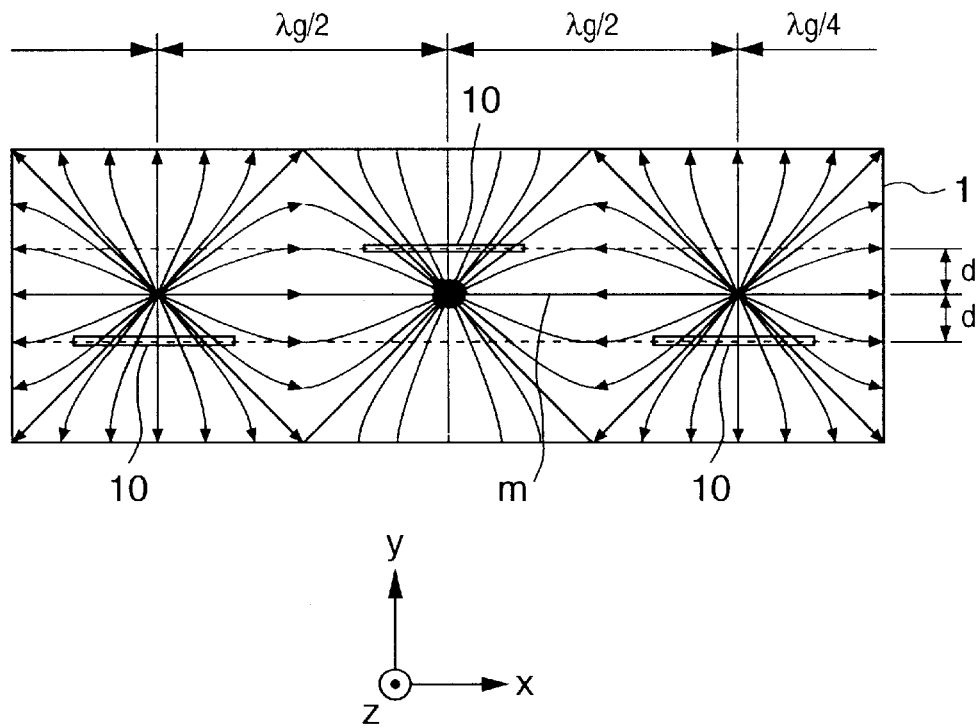

In this embodiment, as shown in FIGS. 2A and 2B, the surface of each waveguide 1 in which the slots 10 are formed is a long end face, i.e., an H plane, of the waveguide 1. In this arrangement, the respective slots 10 are arranged at a predetermined pitch along a central line m in the longitudinal direction of the H plane to be alternately located on the left and right sides of the central line m and spaced apart from the central line m by a predetermined distance d.

In general, a surface of a rectangular waveguide which is parallel to an electric field is called an E plane, and a surface which is parallel to a magnetic field is called an H plane. When the electric field mode is the TE10 mode or H01 mode as in the present invention, a short end face of a rectangular waveguide is an E plane, and a long end face is an H plane.

In this embodiment, the predetermined pitch is set to λg/2 (λg: the waveguide wavelength of microwaves in the waveguide) to decrease the distance (pitch) between the centers of the portions in which laser emission occurs. Decreasing the predetermined pitch in this manner as well will equalize the phases of electromagnetic waves emitted through all the slots 10.

If the slots 10 are formed in a line in a short end face (E plane) of the waveguide 1 in the longitudinal direction, the predetermined pitch must be set to λg to equalize the phases of electromagnetic waves emitted through all the slots 10, resulting in difficulty in decreasing the laser emission pitch. In contrast to this, in this embodiment, the predetermined pitch can be decreased to λg/2 while the phases of microwaves are kept uniform. This realizes emission of microwaves uniform as a whole over the longitudinal direction of the laser tube 2 by equalizing the phases of microwaves emitted through all the slots 10, and allows uniform laser emission with minimum energy loss.

In this case, if the distance between the slots 10 on the left and right sides of the central line m is set to be relatively small, the intensity of emitted microwaves increases. When, however, each slot 10 is taken into consideration, the intensity of a microwave tends to become unevenly high in the central portion. In contrast to this, if the distance between the left and right slots is set to be relatively large, uniform microwave emission can be obtained as a whole. The optimal values of the distance between the left and right slots and their shape may be determined in consideration of the two requirements, i.e., satisfactory intensity and uniformity.

It is also preferable that the waveguide 1 be filled with a dielectric substance 19. This reduces the pitch of the waveguide wavelength λg, and allows more uniform microwave emission.

Examples of usable dielectric substances are as shown in Table 1 below. However, dielectric loss generally increases when a dielectric constant increases, so the material must be chosen by taking this into consideration.

TABLE 1

|  | Dielectric constant | Ratio [%] of wavelength λ normalized in the absence of dielectric substance |
| --- | --- | --- |
| Air | 1 | 1.000 |
| Quartz | 3.6 | 0.527 |
| Calcium fluoride | 6.76 | 0.385 |
| Aluminum nitride | 8.8 | 0.337 |
| Alumina | 9.8 | 0.319 |
| Zirconia | 12.5 | 0.283 |

When the waveguide 1 is filled with these dielectric substances, the waveguide wavelength in the waveguide 1 decreases at the wavelength ratios described in Table 1. This makes it possible to sufficiently uniformize the wavefront of a microwave.

More specifically, the waveguide 1 was manufactured to have a (long side)=42 mm, b (short side)=21 mm, and a resonator length (in the laser oscillation direction) of 220.8 mm. The waveguide 1 was filled with alumina having a dielectric constant of 9.8. In this case, the wavelength of a microwave in the waveguide 1 was 44.2 mm, and hence the pitch (the above predetermined distance) of the slots 10 was set to 22.1 mm. When laser emission was produced, sufficiently uniform emission was obtained. This waveguide 1 can be suitably applied to a laser oscillating apparatus using a reflection system.

Modifications of this embodiment will be described below. Note that the same reference numerals as in the embodiment denote the same parts, and a detailed description thereof will be omitted.

(Modification 1)

In Modification 1, the waveguide 1 has a conductor plate, i.e., a metal wall 12 in this case, in a portion between the waveguide wall and the laser tube wall except for a region above the slots 10. This metal wall 12 separates the waveguide wall from the laser tube wall by a predetermined distance.

Figure 3:
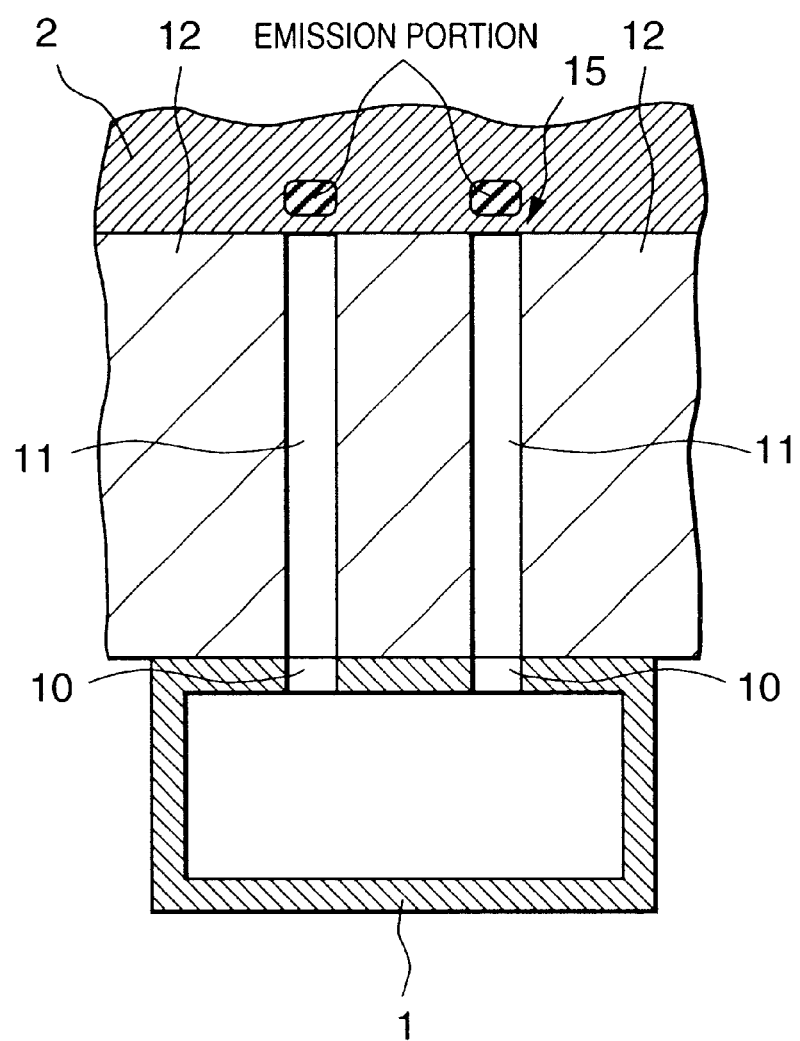
FIG. 3 is a schematic sectional view showing a portion near a waveguide in which a passage is formed by a metal wall in Modification 1 of the first embodiment.

FIG. 3 shows the details of a portion near the waveguide 1. FIG. 3 is a sectional view taken along the short-side direction of the slot 10.

In this modification, the slots 10 are arranged at a pitch of λg/2 in the H plane along the central line m in the longitudinal direction of the H plane to be alternately located on the left and right sides of the central line m and spaced apart from the central line m by the distance d. In other words, groups of slots, each arranged in a line at a pitch of λg, are located on the two sides of the central line m and shifted from each other by μg/2 in the longitudinal direction of the H plane.

As shown in FIG. 3, the metal wall 12 is formed between the these groups of slots and the laser tube 2. Two lines of spaces (each having, for example, a width almost equal to that of the slot 10) are formed in the metal wall 12 between the slots 10 and the windows 15 in the laser tube wall to extend over the length of the waveguide 1 in the longitudinal direction of the laser tube 2. These two lines of spaces are microwave passages 11. For the sake of convenience, the left and right slots 10 are drawn in the same plane in FIG. 3.

In this case, the passages 11 may be filled with a dielectric substance. Suitable dielectric substances are quartz, calcium fluoride, aluminum nitride, alumina, and zirconia.

By filling each passage 11 with the dielectric substance, the generation of a plasma in the passage 11 can be prevented. This dielectric substance used desirably has a high dielectric constant and a small dielectric loss for more efficient propagation of a microwave.

The distance from the slots 10 to the windows 15 of the laser tube wall is an integral multiple of the waveguide half-wave length of a microwave introduced from the waveguide 1, i.e., is a distance d represented by $$d = n \times \lambda g/2 \quad (1)$$

where λg is the waveguide wavelength of a microwave, and n is an integer.

Accordingly, the passage 11 functions as a resonator to prevent a microwave emitted from each slot 10 from interfering with a reflected wave from the laser tube 2 and weakening each other.

The integer n can take any arbitrary value. However, if this value is too large, when a microwave propagates in the passage 11, the loss by absorption of the microwave to the metal wall 12 increases. Hence, the integer n is most preferably set to below 3.

The width (in the y direction) of the passage 11 is preferably equal to or larger than the width of the slot 10 in the short-axis direction (y direction). In this case, the width of the passage 11 is an integral multiple of the waveguide half-wave length of a microwave introduced from the waveguide 1, i.e., is a width w represented by $$w = n \times \lambda g/2 \quad (2)$$

If, however, n>0, the width of the passage 11 is set to almost equal to the width of the slot 10 in the short-axis direction (y direction).

The wavefronts of microwaves can be almost satisfactorily made uniform even immediately after the microwaves are emitted from the slots 10 because the two arrays of slots are formed at a substantially accurate pitch of λg/2. With the formation of the passages 11 defined by the metal wall 12 between the slots 10 and the laser tube 2, a microwave emitted from each slot 10 gradually approaches a plane wave as it propagates along the passage 11. When the microwave is emitted outside (i.e., into the laser tube) through the passage 11, its wavefront assumes a substantially plane-wave shape over the entire formation region of the slots 10.

Accordingly, a microwave in the form of a more uniform plane wave reaches the excimer laser gas in the laser tube 2. This realizes uniform plasma discharge over the length of the laser 2 and helps uniformize laser emission.

More specifically, the waveguide 1 was manufactured to have a (long side)=42 mm, b (short side)=21 mm, and a resonator length (in the laser oscillation direction) of 220.8 mm. The waveguide 1 was filled with alumina having a dielectric constant of 9.8. The width of the passage 11 in the longitudinal direction (laser oscillation direction) was set to 220.8 mm, which was equal to the resonator length. In this case, the waveguide wavelength of a microwave in the waveguide 1 was 39.2 mm. The passage length (the distance from the slot 10 to the emission portion) was wet to 58.9 mm, which was 1.5 times the waveguide wavelength. When laser emission was produced, sufficiently uniform emission was obtained.

(Modification 2)

Figure 4:
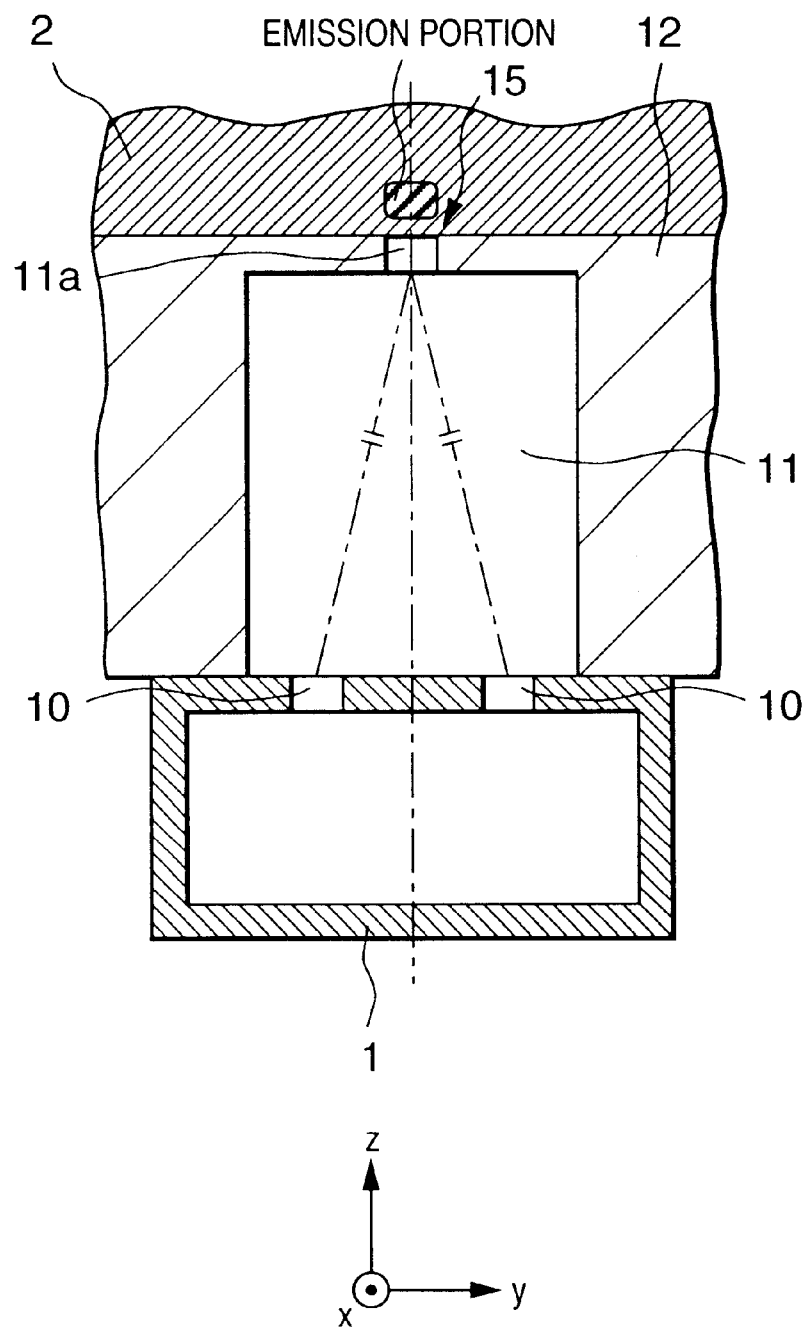
FIG. 4 is a schematic sectional view showing a portion near a waveguide in which a passage is formed by a metal wall in Modification 2 of the first embodiment.

In Modification 2, the metal wall 12 is formed in the waveguide 1 as in Modification 1. As shown in FIG. 4, however, the passage 11 is formed wide enough to include the slots on the left and right sides of the central line, and only a distal end portion 11a is formed narrow. This passage 11 extends in the form of a slit over the length of the laser tube 2. In this case as well, the thickness of the passage 11 is preferably set to an integral multiple of the half-wave length of waveguide wavelength, i.e., λg/2, with which the energy density near the distal end portion 11a becomes highest.

According to the laser oscillating apparatus of Modification 2, an electromagnetic wave in the form of a highly uniform plane wave reaches the excimer laser gas in the laser tube 2. This realizes uniform plasma discharge over the length of the laser tube 2 and helps uniformize laser emission.

(Modification 3)

In Modification 3, the passage 11 is formed wide enough to include the slots 10 on the left and right sides of the central light as in Modification 2. As shown in FIG. 5, however, only distal end portions 11a are formed narrow in correspondence with the slots 10. An even number of (two in this case) distal end portions 11a extend in the form of slits over the length of the laser tube 2.

In this case, emission in the form of a plurality of slits, which is suited for a laser oscillator using a prism reflection system, can be realized. In the prism reflection system, prisms are used as the reflecting structures 5 and 6 of the laser tube 2, and light paths of the laser light are different in the outgoing trip and returning trip. In this case, the emission source (slot) pitch of the passage 11 is not accurately set to λg/2 unlike in the single slit structure. However, since emission from the slots 10 on the opposite side also contributes to excitation (when, for example, the slit on the right side is taken into consideration, the main emission source is the slot array on the right side, but emission from the slots 10 on the left side also reaches and contributes to laser gas excitation), more uniform emission than in Modification 2 can be performed.

To make emission of microwaves from the left and right slits more uniform, the positions of the slots 10 and slits 110a must be axially symmetrical. In this case, however, since in-phase emission from the H-plane antenna is used, the slit group on the left side is shifted from the slit group on the right side by μg/2 in the laser oscillation direction.

The interval between the group of slots 10 on the left side and the group of slots 10 on the right side need not be equal to the interval between the slit 11a on the left side and the slit 11a on the right side. As the interval between the left and right slits 11a decreases, in particular, the emission source pitch reaches λg/2, improving the uniformizing effect. The thickness of the passage 11 (the length in the z direction) is preferably set to λg/2. To increase the energy of microwaves emitted from the slits, the thickness of the passage 11 is preferably set to λg/2 with which the energy density becomes highest. Obviously, if the same waveguide 1, passage width, and passage length as those in Modification 2 are used, the thickness becomes 19.6 mm.

According to the laser oscillating apparatus of Modification 3, a microwave in the form of a more uniform plane wave reaches the excimer laser gas in the laser tube 2. This realizes uniform plasma discharge over the length of the laser 2 and helps uniformize laser emission.

(Modification 4)

Figure 6:
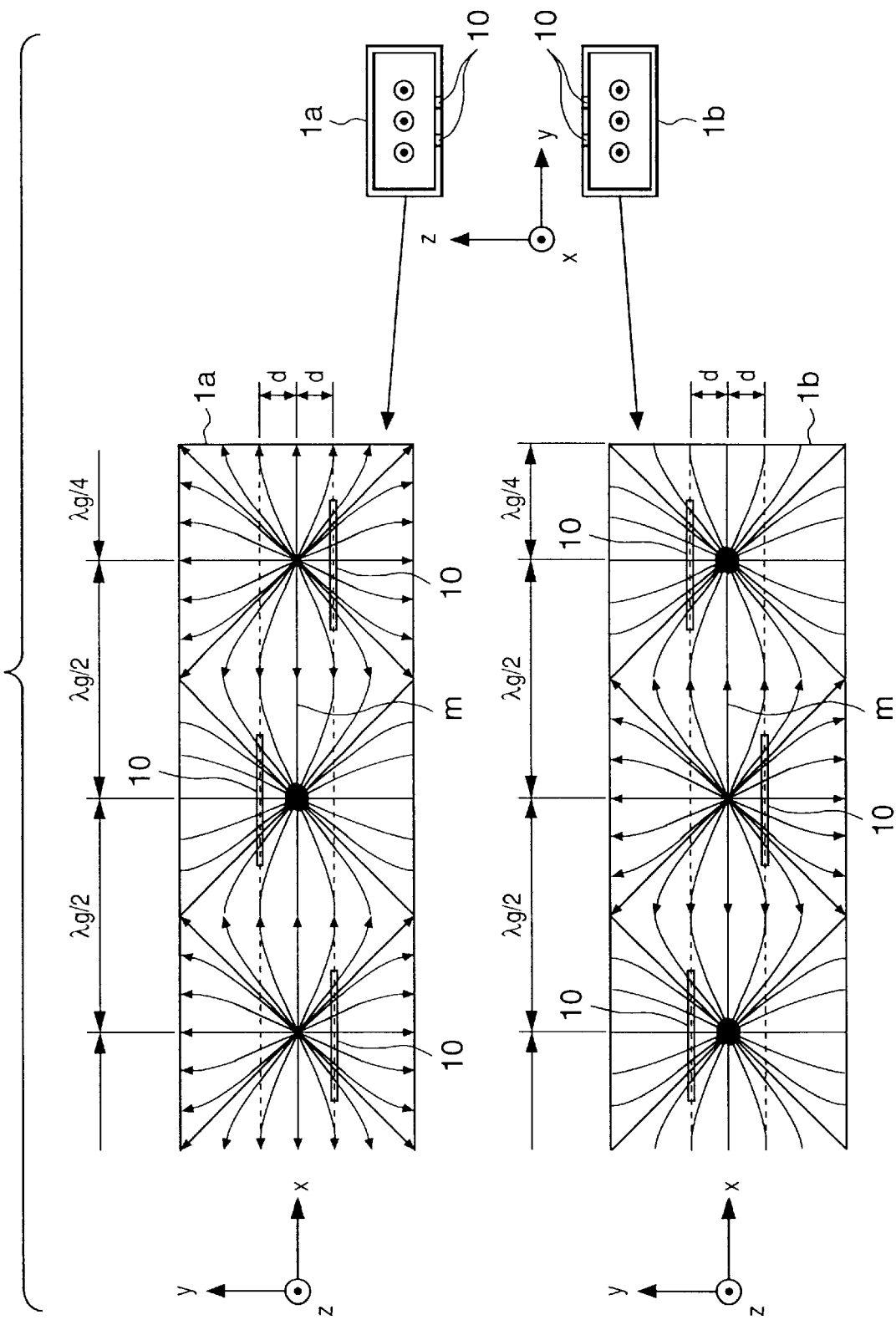
FIG. 6 is a schematic view showing a pair of waveguides in Modification 4 of the first embodiment.

In Modification 4, as shown in FIG. 6, a pair of waveguides 1a and 1b are arranged such that the H planes vertically sandwich the laser tube 2 (not shown for the sake of convenience). Each of the waveguides 1a and 1b has the same arrangement as that of the guide tube 1 of this embodiment.

In this modification, the slots 10 are formed in the pair of waveguides 1a and 1b such that the slots are located on the left and right sides of the central line m when the waveguides are seen in a superimposed state. In this case, as in the above embodiment, neither space shift nor phase shift is required.

The arrows in FIG. 6 (ditto for FIG. 2B) represent currents flowing through the waveguide walls when only traveling waves are taken into consideration. A microwave exists as a standing wave in a propagation space defined by the distance in the longitudinal direction of the waveguide 1. Owing to this standing wave, the current in the waveguide wall also takes the form of standing wave. However, the form of the standing wave of a microwave is three-dimensional and complicated. It is therefore convenient to consider, as an index, the distribution of currents propagating in one direction.

One of the characteristic features of the H-plane antenna is that the distributions of currents formed on the upper and lower surfaces of the waveguides 1a and 1b are in opposite directions. If a resonance waveguide is formed by opposing H planes, the lower surface of the upper guide wave 1a and the upper surface of the lower waveguide 1b respectively become the upper and lower surface of the space in which a laser beam is pumped. If, therefore, the slots in the upper and lower waveguides 1a and 1b are located at complementary positions (for example, at a position in the upper waveguide 1a (in the longitudinal direction of the waveguide) where the slot 10 is located on the right side of the central line m, the slot 10 is located on the left side of the central line m in the lower waveguide 1b), in-phase microwaves are emitted from the upper and lower slots 10 alternately located at a pitch of λg/2 without any change in the positional relationship between the upper and lower waveguides 1a and 1b.

This technique can be applied to all Modifications 1 to 3, resulting in more uniform excitation in each modification.

Figure 7:
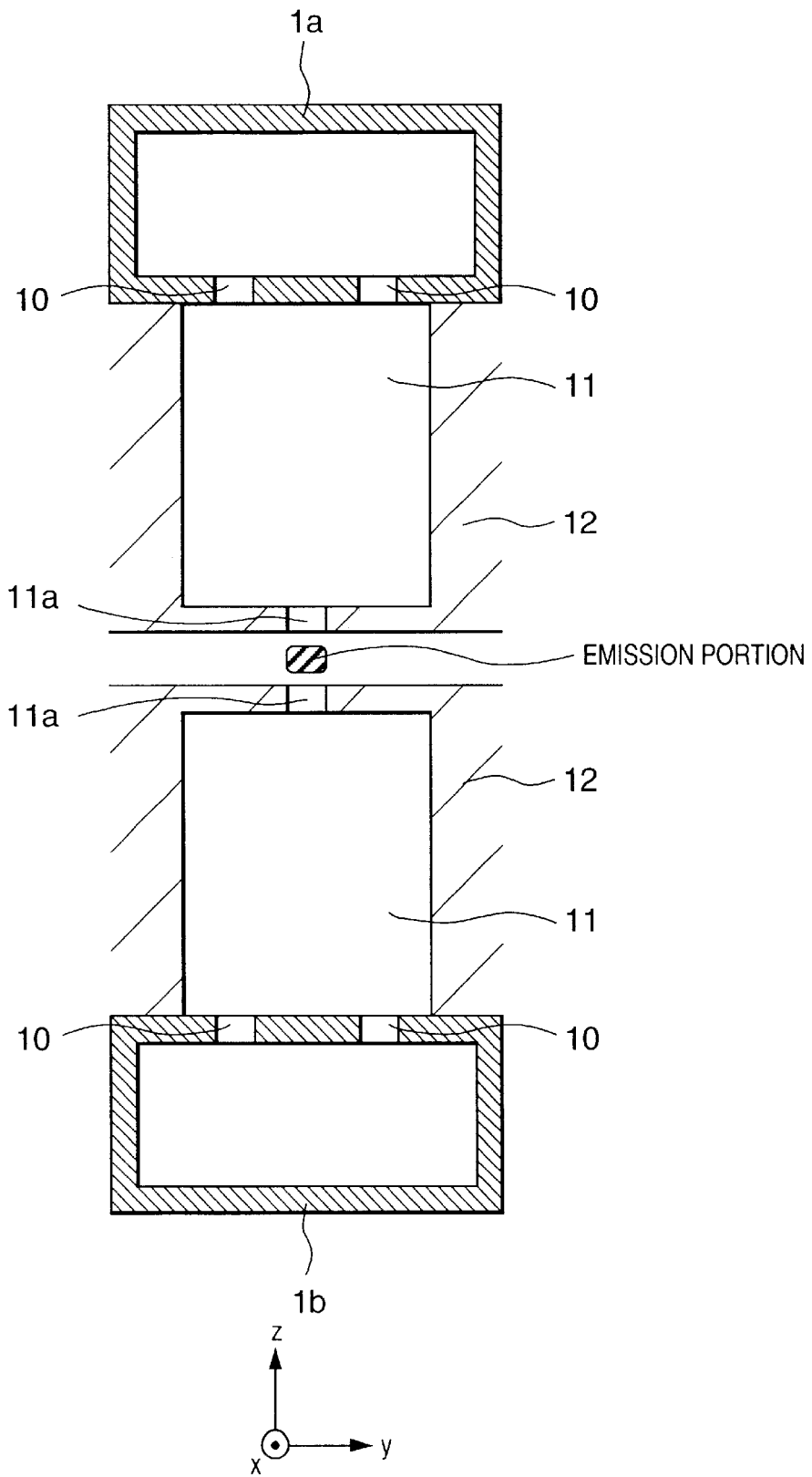
FIG. 7 is a schematic sectional view showing a portion near waveguides in which passages are formed by metal walls in an application example of Modification 4 of the first embodiment.
Figure 8:
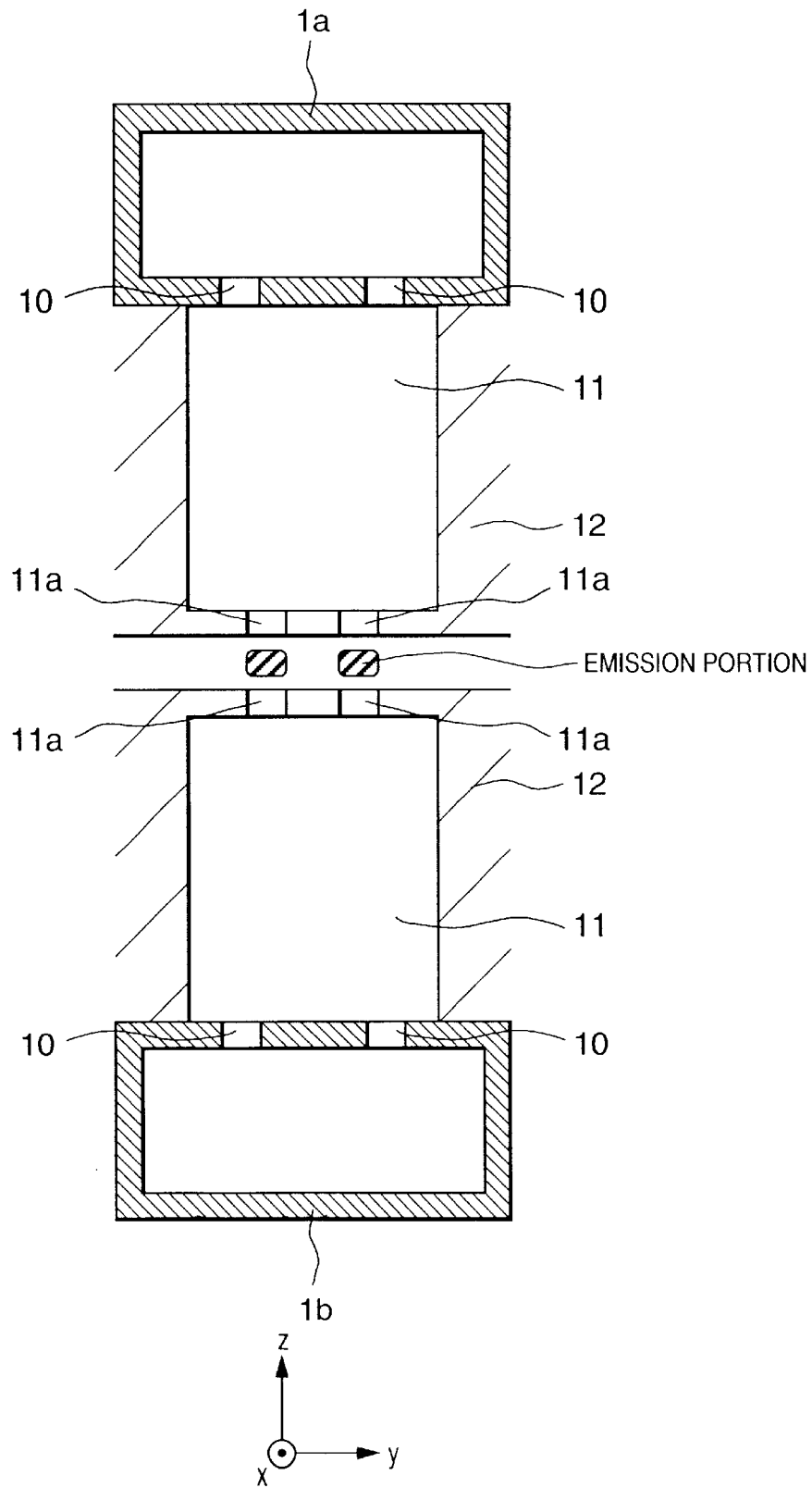
FIG. 8 is a schematic sectional view showing a portion near waveguides in which passages are formed by metal walls in another application example of Modification 4 of the first embodiment.

FIG. 7 shows a case wherein Modification 4 is applied to Modification 2, and the waveguides 1 (1a, 1b) of Modification 2 are located on the upper and lower sides of the laser tube 2. FIG. 8 shows a case wherein Modification 4 is applied to Modification 3.

According to Modification 4, in-phase, uniform microwaves are emitted from all the upper and lower slots 10, and hence uniform plasma discharge is realized over the length of the laser tube 2. By forming the passages 11 using the metal walls 12 as shown in FIGS. 7 and 8, as well as employing this technique, more uniform plasma discharge is realized.

(Modification 5)

Figure 9:
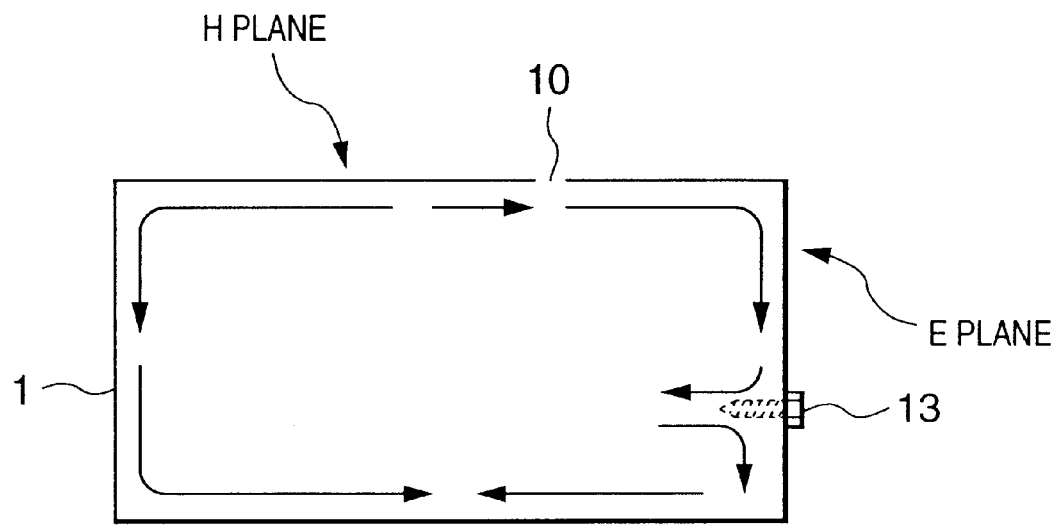
FIG. 9 is a schematic sectional view showing a structure having a metal screw turned into an E plane of a waveguide in Modification 5 of the first embodiment.

In Modification 5, as shown in FIG. 9, a minute metal member, a metal screw 13 in this case, which is used to adjust the impedance of the slot 10 is embedded in the short end face (E plane) of the waveguide 1.

With this metal screw 13, the symmetry of currents (indicated by the arrows in FIG. 9) flowing through the wall of the waveguide 1 is lost. As a consequence, the impedance of the slot 10 can be finely adjusted. In addition, this can compensate for mechanical dimensional errors caused in forming a plurality of slits.

Furthermore, when the metal screw 13 is embedded, currents concentrate on a portion near the metal screw 13. If, therefore, a plurality of metal screws 13 are arranged in the longitudinal direction of the slot 10, the impedance of the slot 10 in the longitudinal direction can be finely adjusted.

(Modification 6)

Figure 10A:
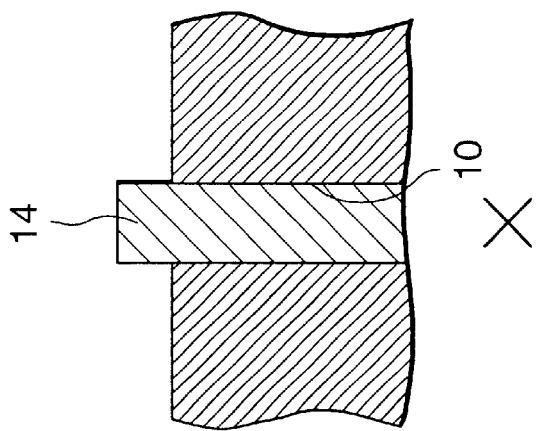
FIGS. 10A to 10C are schematic sectional views each showing a structure in which a slot is filled with a dielectric substance in Modification 6 of the first embodiment.
Figure 10B:
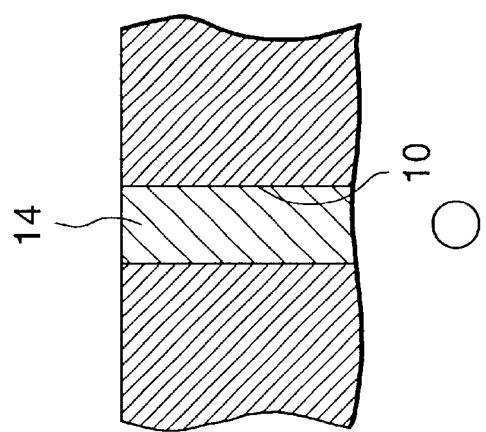
Figure 10C:
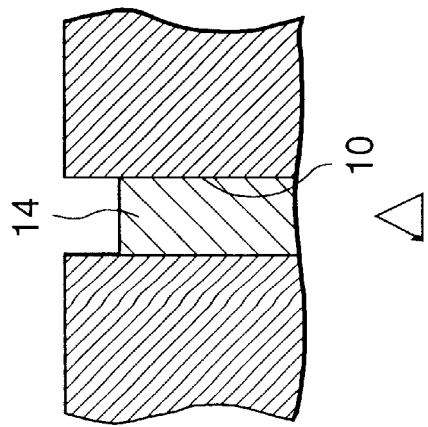

In Modification 6, as shown in FIGS. 10A to 10C, the slot 10 is filled with a dielectric substance 14. In this case, it is more preferable that the slot 10 is filled with the dielectric substance 14 such that the distal end face of the slot 10 be flattened, as shown in FIG. 10B.

Figure 11:
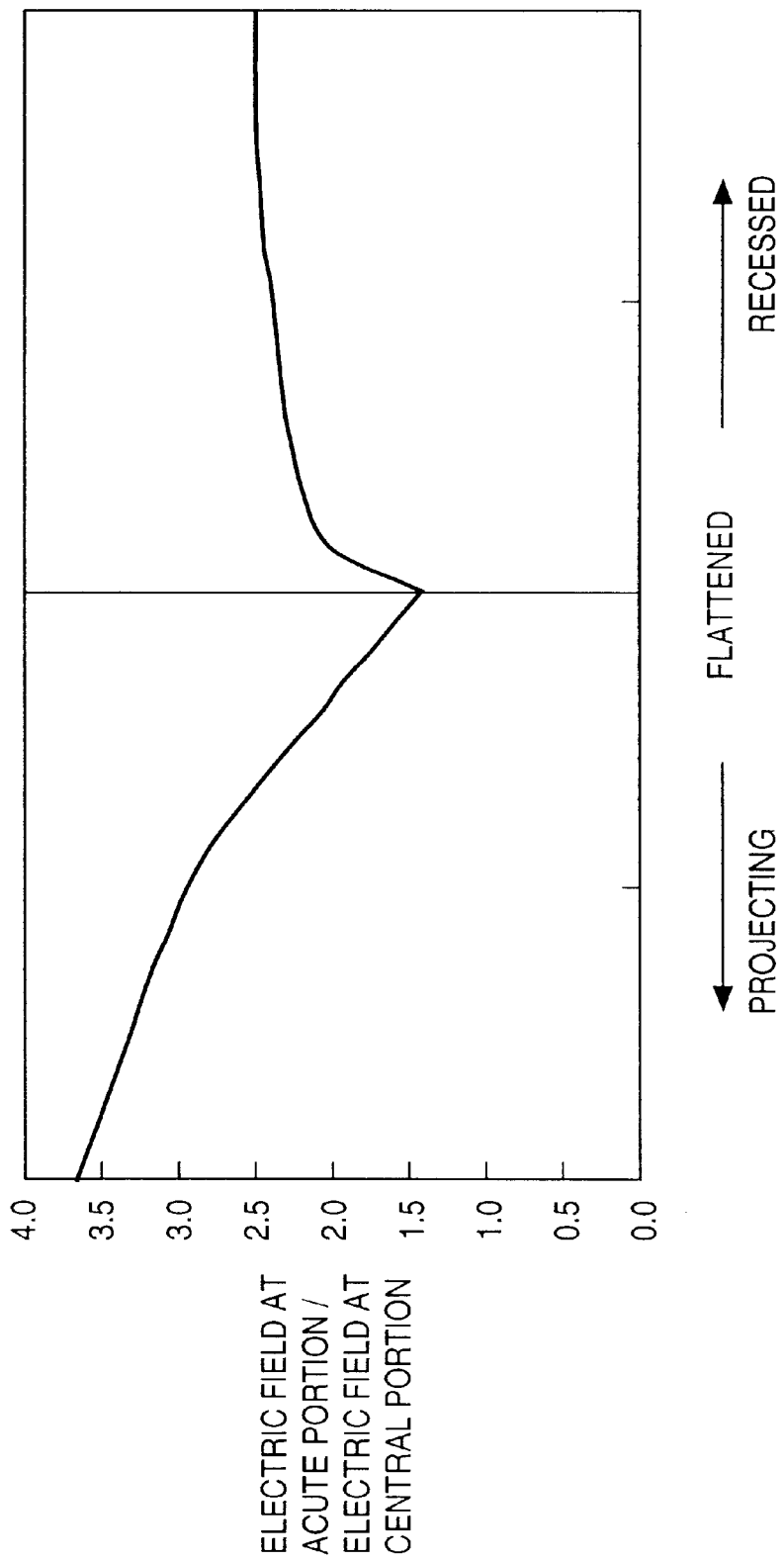
FIG. 11 is a graph showing the ratios of electric field intensity at acute portions of slot plates/electric field intensity at central portions of the slot plates in Modification 6 of the first embodiment.

More specifically, FIG. 11 shows the ratios of (electric field intensity at acute portion)/(electric field intensity at central portion) of a slot plate forming the upper surface of the waveguide 1 in the case wherein the dielectric substance 14 is recessed (FIG. 10A) and the case wherein the dielectric substance 14 protrudes (FIG. 10C) in comparison with each other. Obviously, when the distal end face is flattened, the minimum electric field intensity ratio is obtained. By flattening the distal end face of the slot 10, therefore, the electric field at the acute portion can be reduced most, and efficient laser emission can be realized. In addition, in the case of high-speed gas circulation, the dead space can be minimized with this flat end face. This makes it difficult to produce a turbulent flow. This technique can also be applied to distal end portion 11a.

If a dielectric constant $\epsilon$ of the dielectric substance 14 is high, energy $\epsilon E^2/2$ of an electric field $\epsilon$ of a microwave propagating through the dielectric substance increases in proportion to $\epsilon$. As the dielectric constant $\epsilon$ increases, therefore, the energy of a microwave propagating through the slot 10 increases.

As described above, according to the excimer laser oscillating apparatuses of this embodiment and its modifications, in the slot array structure, uniform electromagnetic wave emission is realized as a whole over the length of the laser tube, and uniform laser emission can be performed with minimum energy loss.

Second Embodiment

The second embodiment will be described below. In the second embodiment, as in the first embodiment, an excimer laser oscillating apparatus for emitting a so-called excimer laser beam will be explained.

Figure 12:
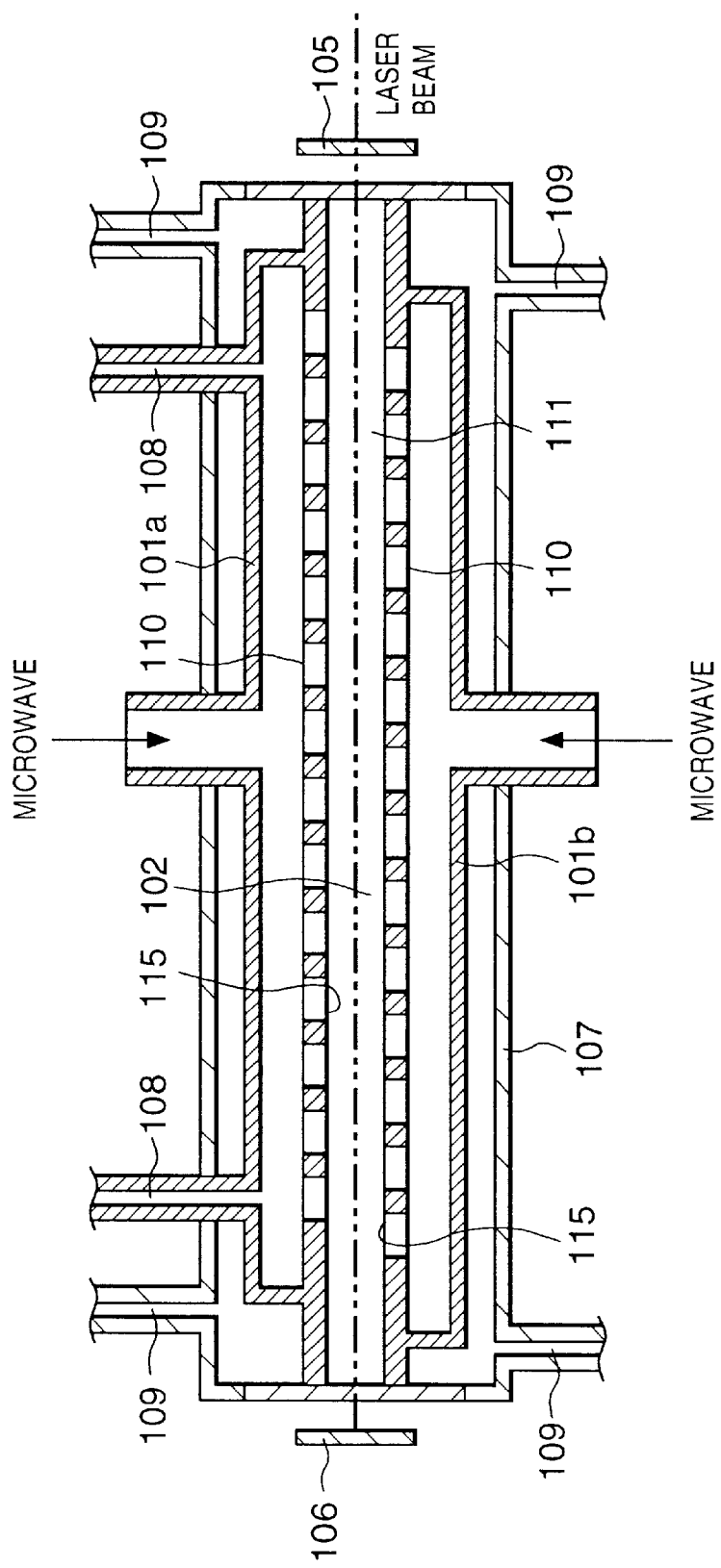
FIG. 12 is a sectional view showing the main parts of an excimer laser oscillating apparatus according to the second embodiment of the present invention.

FIG. 12 is a schematic view showing the major components of an excimer laser oscillator according to this embodiment.

As shown in FIG. 12, this excimer laser oscillator comprises a laser tube 102, a pair of waveguides 101a and 101b, and a cooling vessel 107. The laser tube 102 emits a laser beam by resonating light emission caused by excitation of an excimer laser gas. The waveguides 101a and 101b excite the excimer laser gas in the laser tube 102 into a plasma. The cooling vessel 107 has cooling water inlet/outlet ports 109 for cooling the waveguides 101a and 101b.

The excimer laser gas as a material for generating an excimer laser beam is at least one inert gas selected from Kr, Ar, Ne, and He, or a gas mixture of at least one inert gas described above and $F_2$ gas. These gases can be appropriately selected and used in accordance with the wavelength of interest. For example, KrF is used when laser beam with a wavelength of 248 nm is to be generated; ArF is used when a laser beam with a wavelength of 193 nm is to be generated; $F_2$ is used when a laser beam with a wavelength of 157 nm is to be generated; $Kr_2$ is used when a laser beam with a wavelength of 147 nm is to be generated; ArKr is used when a laser beam with a wavelength of 134 nm is to be generated; and $Ar_2$ is used when a laser beam with a wavelength of 126 nm is to be used.

The laser tube 102 has laser gas inlet/outlet ports 108 through which the excimer laser gas is introduced into the tube, and reflecting structures 105 and 106 at the two end portions. These reflecting structures 105 and 106 equalize the phases of light by plasma discharge and generate a laser beam.

The waveguides 101a and 101b are means for supplying a microwave to the laser gas in a gas supply passage structure 111. A plurality of long and narrow slots 110 are formed in the upper surface. When a microwave with a frequency of a few hundred MHz to several tens of GHz is introduced from the upper portions of the waveguides 101a and 101b, this microwave propagates in the waveguides 101a and 101b and is emitted from the slots 110 to the outside of the waveguides 101a and 101b. The emitted microwave is introduced into the laser tube 102 through a window 115 formed in this laser tube 102. The microwave thus introduced excites the excimer laser gas in the laser tube 102, thereby generating an excimer laser beam by resonance.

Figure 13:
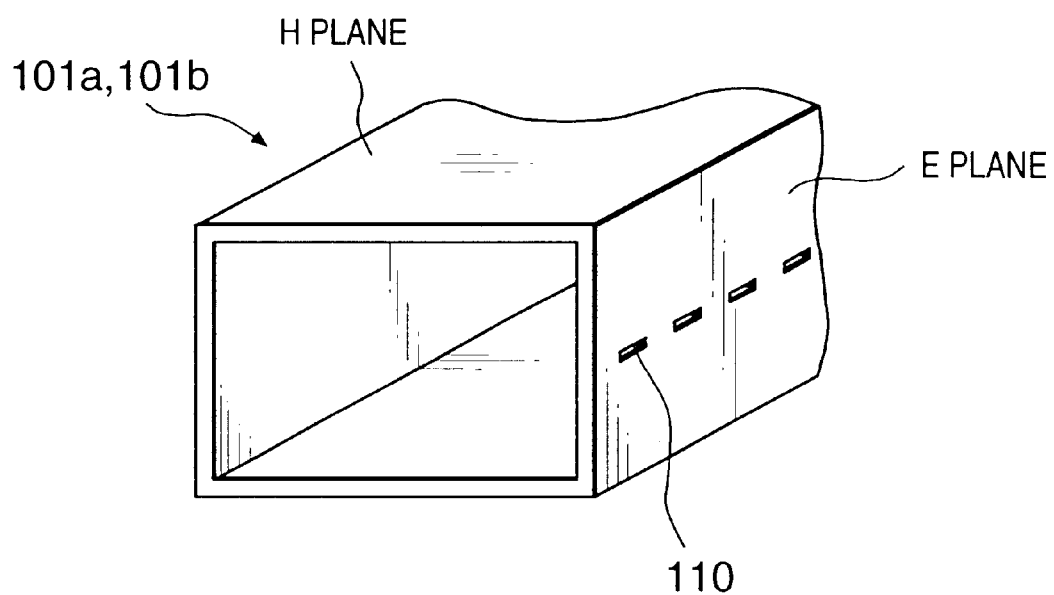
FIG. 13 is a perspective view showing the slot formation surface (E plane) of a waveguide.

In this embodiment, as shown in FIG. 13, the formation surface of the slots 110 is the short end face of each of the waveguides 101a and 101b, i.e., the ϵ plane. Also, these slots 110 are formed in a line at equal intervals in the longitudinal direction.

In general, a surface of a rectangular waveguide which is parallel to an electric field is called an E plane, and a surface which is parallel to a magnetic field is called an H plane. When the electric field mode is the TE10 mode or H01 mode as in the present invention, a short end face of a rectangular waveguide is an E plane, and a long end face is an H plane.

In this embodiment, the waveguides 101a and 101b as described above are so formed as to vertically sandwich the laser tube 102. These waveguides 101a and 101b are arranged such that the slots 110 of the waveguides 101a and 101b are shifted a predetermined distance relative to each other (spatial shift; to be simply expressed as "shift" in the following tables). Furthermore, a phase adjusting shifter is used to shift the phases of microwaves supplied into the waveguides 101a and 101b relative to each other (phase shift; to be expressed as "shifter" in the following tables).

Figure 14:
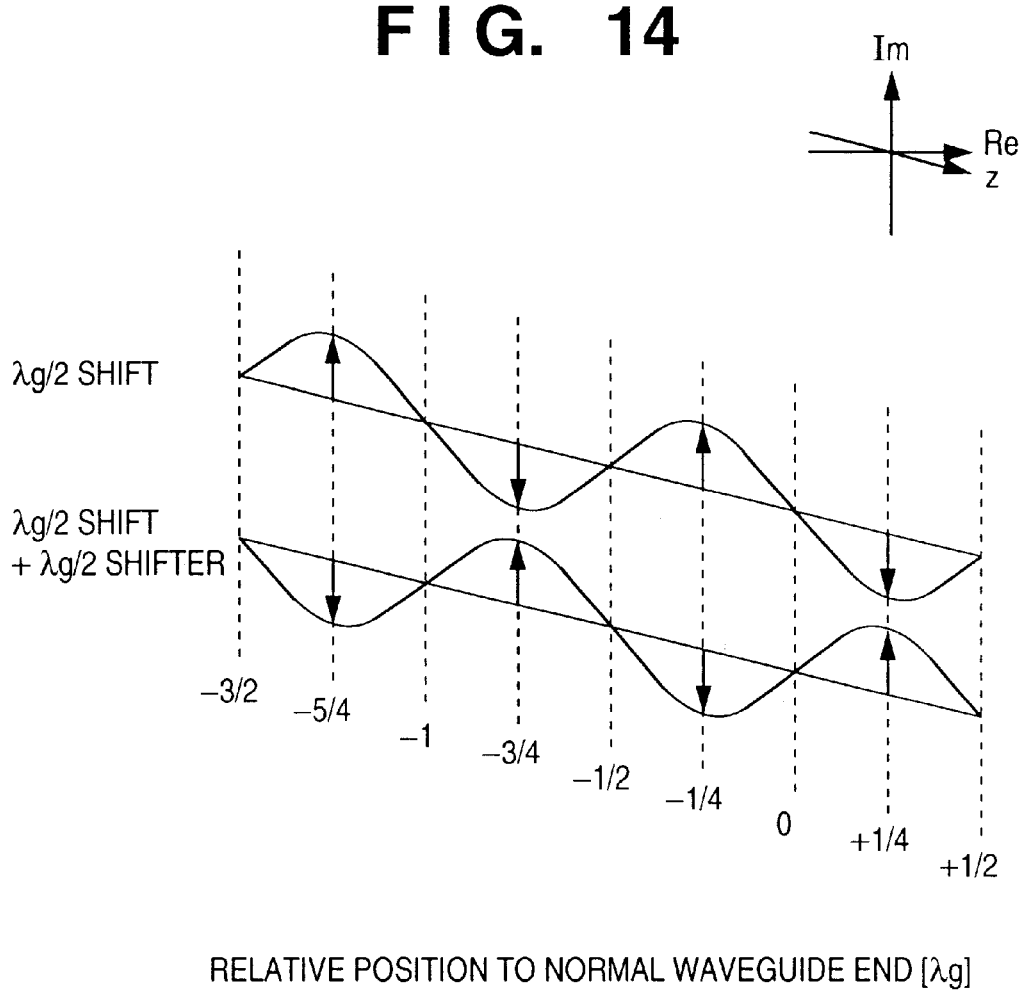
FIG. 14 is a graph showing the relationship between the standing waves of a microwave when space shift and phase shift are performed.

FIG. 14 is a graph showing the standing waves of microwaves in the waveguides 101a and 101b when the slots 110 are shifted a distance of λg/2, and when the slots 110 are shifted a distance of λg/2 and the phases are shifted by λg/2.

Calculations for deriving the phase relationship between the standing waves in each case will be represented by the following equations.

Assuming that an incident wave passing through the phase adjusting shifter and shifted in phase by θ is $$\exp(i(\omega t - \beta z + \theta - \pi/2))$$

a reflected wave is $$\exp(i(\omega t + \beta z + \theta + \pi/2 - 2\beta d))$$

by taking account of a path length difference $2d$ produced because the waveguide end moves a distance d and phase inversion due to reflection at the waveguide end. Accordingly, assuming there is no attenuation, the standing wave generated is When d=μg/2 and θ=0 (λg/2 shift)

$$2\exp[i\omega(t-T/2)]\sin \beta(z-\lambda g/2)$$

When d=μg/2 and θ=π(λg/2 shift+μg/2 shifter)

$$2\exp(i\omega t)\sin \beta(z-\lambda g/2)$$

From these relationships, the intensity-phase relationship between the standing waves is obtained.

When a waveguide in which the slots 110 are formed in the ϵ plane at a pitch of λg/2 is used, microwaves emitted from adjacent slots are in opposite phases, so a space in which microwaves do not oscillate is formed between these slots. That is, an area inevitably exists, in which the excitation intensity of a laser gas drops to 0. When a waveguide in which the slots 110 are formed in the ϵ plane at a pitch of λg is used, microwaves emitted from adjacent slots are in phase with each other and hence do not cancel out each other. That is, in-phase microwaves are emitted from a plurality of different slots 110. This means that the electric fields of microwaves are set in phase. In other words, as the electric fields of microwaves are set in phase, currents and electric fields are orientated in the same direction. It is therefore inevitable that there is no area in which the excitation intensity of a laser gas drops to 0. As a consequence, the excitation intensity does not drop to 0 at any positions in the optical axis direction (longitudinal direction), thereby allowing more uniform excitation.

In this embodiment, a laser oscillating apparatus is so constructed that predetermined space shift and predetermined phase shift are performed by using a pair of waveguides having a pitch of λg, thereby complementing the microwave emission characteristics of the waveguides 101a and 101b described above.

A case in which the waveguides 101a and 101b are normally opposed with not space shift and no phase shift, a case in which the waveguides 101a and 101b are spatially shifted relative to each other, and a case in which both space shift and phase shift are performed will be described below for the pitch λg of the slots 110 of the waveguides 101a and 101b.

First, an example of the normal opposing arrangement is shown in Table 2 (pitch λg). In Table 2, the distribution in the laser resonance direction of a microwave in the upper waveguide 101a and the distribution of a microwave in the lower waveguide 101b are indicated in upper and lower cells for each time (t). The + and − signs indicate the polarity in an antinode of the standing wave of a microwave. Hatched portions in each table indicate the slots 110 actually formed in the upper and lower waveguides 101a and 101b. Note that hatched portions in Tables 3 to 6 (to be described later) have the same meaning as in Table 1.

TABLE 2

Normal slots (pitch λg/2)

| t \ z | -3/2 | -5/4 | -1 | -3/4 | -1/2 | -1/4 | 0 | 1/4 | 1/2 |
|---|---|---|---|---|---|---|---|---|---|
| +0 | - | 0 | + | 0 | - | 0 | + | None | None |
|  | - | 0 | + | 0 | - | 0 | + | None | None |
| +1/4 | 0 | 0 | 0 | 0 | 0 | 0 | 0 | None | None |
|  | 0 | 0 | 0 | 0 | 0 | 0 | 0 | None | None |
| +1/2 | + | 0 | - | 0 | + | 0 | - | None | None |
|  | + | 0 | - | 0 | + | 0 | - | None | None |
| +3/4 | 0 | 0 | 0 | 0 | 0 | 0 | 0 | None | None |
|  | 0 | 0 | 0 | 0 | 0 | 0 | 0 | None | None |

Each of the waveguides 101a and 101b has the aforementioned properties, and identical standing waves exist in the upper and lower portions. Therefore, the intensity of a microwave increases.

In Table 2, the phases of microwaves are the same at all positions in the z direction.

Figure 15:
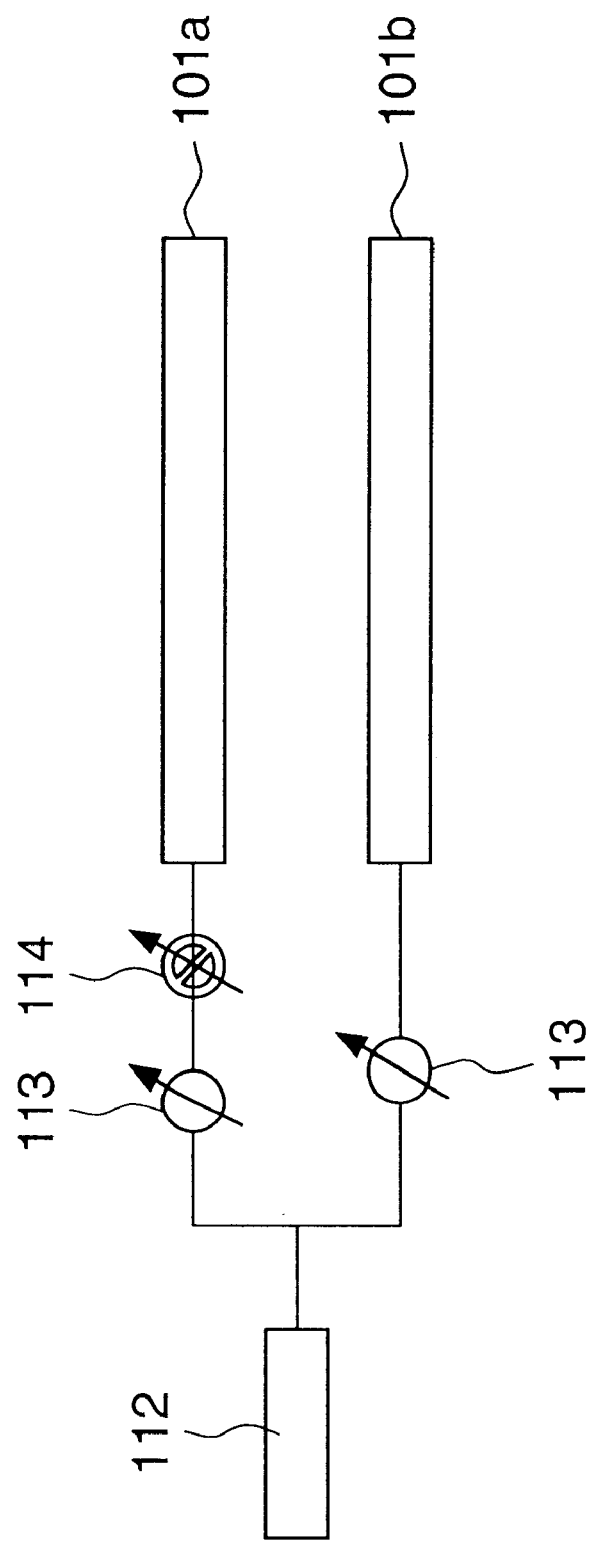
FIG. 15 is a schematic view showing a portion near waveguides normally arranged in the excimer laser oscillating apparatus according to the second embodiment of the present invention.

A case in which space shift and phase shift are performed will be described below. FIG. 15 is a schematic view showing the vicinities of the waveguides 101a and 101b when these shift operations are performed. In FIG. 15, reference numeral 112 denotes a microwave source connected to both of the waveguides 101a and 101b; and 113, tuners respectively connected to the waveguides 101a and 10b. These tuners 113 are, e.g., 3-stab tuners or E-H tuners and have a function of minimizing reflections from the waveguides 101a and 101b to the a microwave source 112. Reference numerals 114 denotes a phase adjusting shifter for shifting the phases of microwaves supplied into the waveguides 101a and 101b relative to each other. This phase shifter 114 is connected to one of the waveguides 101a and 101b, in this embodiment, to the waveguide 101a.

Table 3 shows a case in which λg/2 space shift is performed in a slot array with a pitch of λg/2. Table 4 shows a case in which λg/2 space shift and λg/2 phase shift are performed in this slot array.

TABLE 3

λg/2 shift slots

| t \ z | -3/2 | -5/4 | -1 | -3/4 | -1/2 | -1/4 | 0 | 1/4 | 1/2 |
|---|---|---|---|---|---|---|---|---|---|
| +0 |  | 0 | + | 0 |  | 0 | + | 0 | - |
|  | - | 0 | + | 0 | - | 0 | + | None | None |
| +1/4 | 0 | 0 | 0 | 0 | 0 | 0 | 0 | 0 | 0 |
|  | 0 | 0 | 0 | 0 | 0 | 0 | 0 | None | None |
| +1/2 | + | 0 |  | 0 | + | 0 |  | 0 | + |
|  | + | 0 | - | 0 | + | 0 | - | None | None |
| +3/4 | 0 | 0 | 0 | 0 | 0 | 0 | 0 | 0 | 0 |
|  | 0 | 0 | 0 | 0 | 0 | 0 | 0 | None | None |

TABLE 4

λg/2 shift + λg/2 shift slots

| t \ z | -3/2 | -5/4 | -1 | -3/4 | -1/2 | -1/4 | 0 | 1/4 | 1/2 |
|---|---|---|---|---|---|---|---|---|---|
| +0 | + | 0 |  | 0 | + | 0 |  | 0 | + |
|  |  | 0 | + | 0 |  | 0 | + | None | None |
| +1/4 | 0 | 0 | 0 | 0 | 0 | 0 | 0 | 0 | 0 |
|  | 0 | 0 | 0 | 0 | 0 | 0 | 0 | None | None |
| +1/2 |  | 0 | + | 0 |  | 0 | + | 0 | - |
|  |  | 0 | - | 0 |  | 0 | - | None | None |
| +3/4 | 0 | 0 | 0 | 0 | 0 | 0 | 0 | 0 | 0 |
|  | 0 | 0 | 0 | 0 | 0 | 0 | 0 | None | None |

Figure 16:
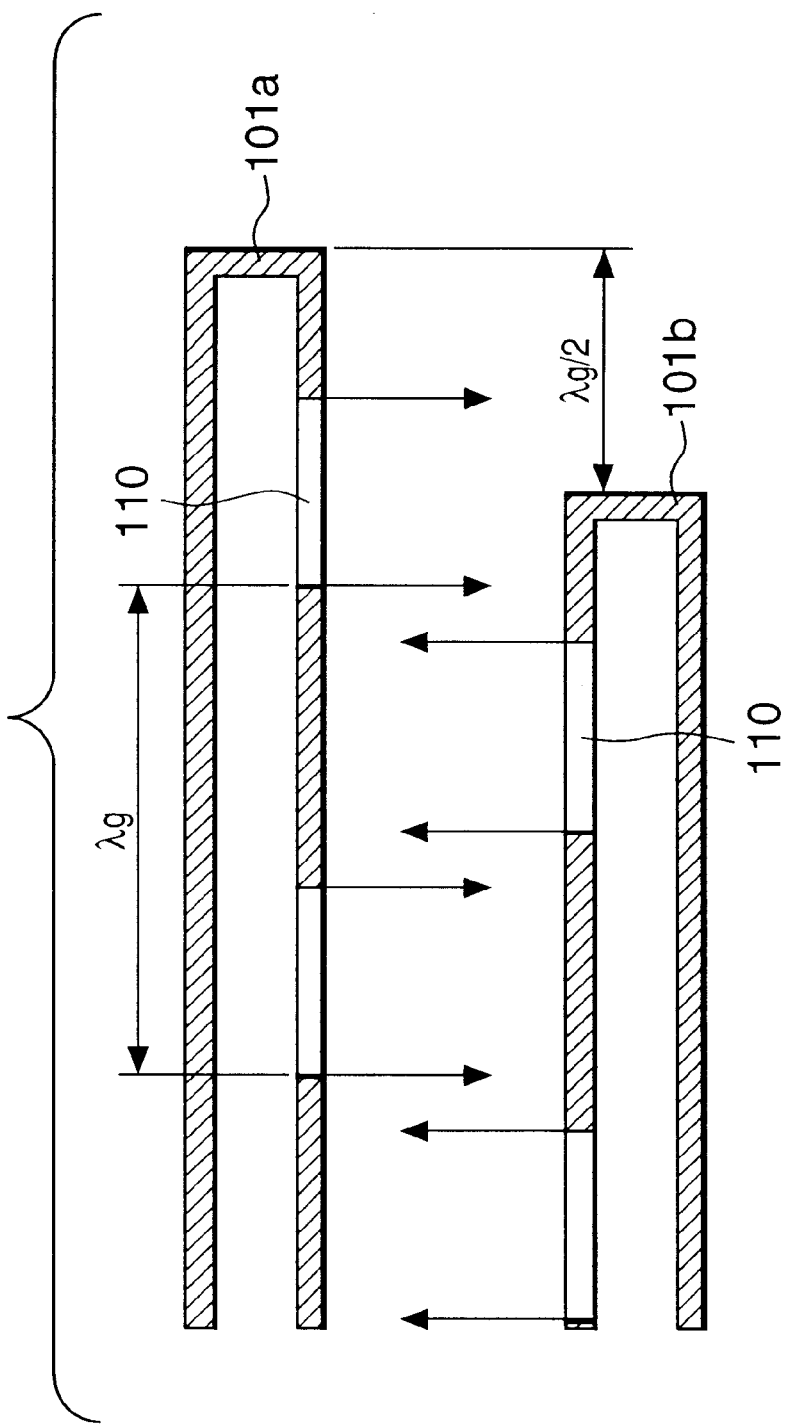
FIG. 16 is a sectional view showing a portion near the waveguides when $\lambda g/2$ space shift and $\lambda g/2$ phase shift are performed at a pitch of $\lambda g$ in the excimer laser oscillating apparatus according to the second embodiment of the present invention.

Table 5 shows a case in which λg/2 space shift is performed in a slot array with a pitch of λg. Table 6 shows a case in which λg/2 space shift and λg/2 phase shift are performed in this slot array. FIG. 16 shows these cases (FIG. 16 is an enlarged view of the waveguides 101a and 101b in FIG. 15).

TABLE 5

λg/2 shift slots

| t \ z | -3/2 | -5/4 | -1 | -3/4 | -1/2 | -1/4 | 0 | 1/4 | 1/2 |
|---|---|---|---|---|---|---|---|---|---|
| +0 |  | 0 | + | 0 |  | 0 | + | 0 |  |
|  | - | 0 | + | 0 | - | 0 | + | None | None |
| +1/4 |  | 0 | 0 | 0 |  | 0 | 0 | 0 |  |
|  | 0 | 0 |  | 0 | 0 | 0 |  | None | None |
| +1/2 | + | 0 | - | 0 | + | 0 | - | 0 | + |
|  | + | 0 |  | 0 | + | 0 |  | None | None |
| +3/4 |  | 0 | 0 | 0 |  | 0 | 0 | 0 |  |
|  | 0 | 0 |  | 0 | 0 | 0 |  | None | None |

TABLE 6

λg/2 shift + λg/2 shifter slots

| t \ z | -3/2 | -5/4 | -1 | -3/4 | -1/2 | -1/4 | 0 | 1/4 | 1/2 |
|---|---|---|---|---|---|---|---|---|---|
| +0 | + | 0 | - | 0 | + | 0 | - | 0 | + |
|  | - | 0 | + | 0 | - | 0 | + | None | None |
| +1/4 |  | 0 | 0 | 0 |  | 0 | 0 | 0 |  |
|  | 0 | 0 |  | 0 | 0 | 0 |  | None | None |
| +1/2 |  | 0 | + | 0 |  | 0 | + | 0 |  |
|  | + | 0 |  | 0 | + | 0 |  | None | None |
| +3/4 |  | 0 | 0 | 0 |  | 0 | 0 | 0 |  |
|  | 0 | 0 |  | 0 | 0 | 0 |  | None | None |

When λg/2 space shift is performed, adjacent slots 110 in the waveguides 101a and 101b are in phase with each other.

When λg/2 space shift and λg/2 phase shift are performed, the problem of the double period of light emission is avoided as described above. Additionally, not only adjacent slots 110 in the waveguides 101a and 101b are in phase with each other, but also the upper and lower slots 110 are in phase with each other over the length of the waveguides 101a and 101b. Accordingly, all the upper and lower slots 110 uniformly emit a microwave in phase with each other. This realizes uniform plasma discharge over the length of the laser tube 102.

As described above, plasma discharge can be uniformized most optimally when λg/2 space shift and λg/2 phase shift are performed at the pitch λg. Note that as described above, even in other cases, the uniformization of plasma discharge can be suitably realized depending on, e.g., the shape of the waveguide or the properties of a microwave.

(Modification)

A modification of this embodiment will be described below. The same reference numerals as in the embodiment denote the same parts, and a detailed description thereof will be omitted.

Figure 17:
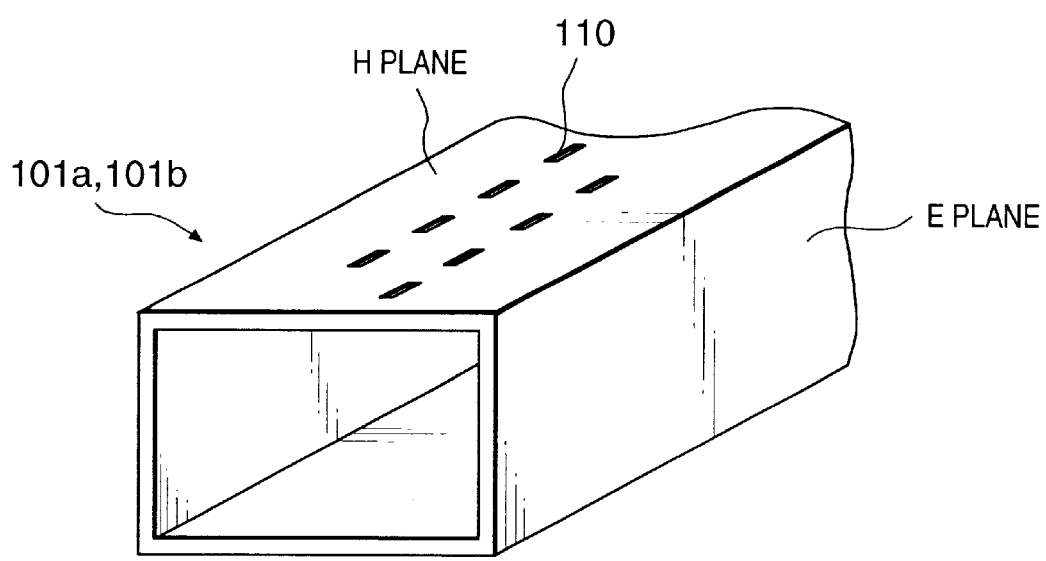
FIG. 17 is a perspective view showing the slot formation surface (H plane) of a waveguide.

In this modification, as shown in FIG. 17, the formation surface of the slots 110 is the long end face, i.e., the H plane, of each of the waveguides 101a and 101b. These slots 110 are arranged at a predetermined pitch (a pitch of λg/2) along the central line in the longitudinal direction of the H plane to be alternately located on the left and right sides of the central line and spaced apart from the central line by a distance d.

Figure 18:
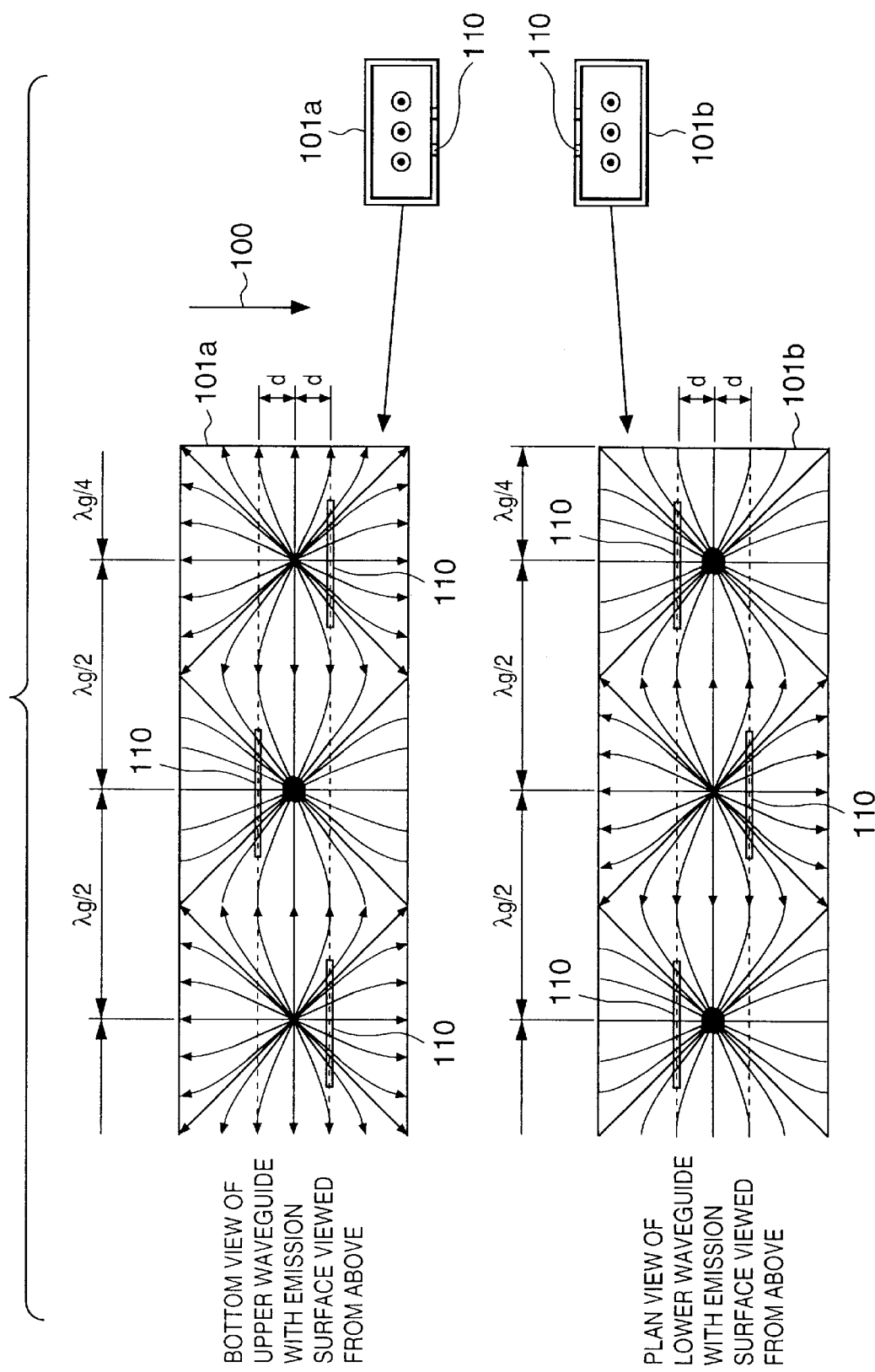
FIG. 18 is a schematic view showing a portion near the waveguides normally arranged in a modification of the excimer laser oscillating apparatus according to the second embodiment of the present invention.

In this modification, as shown in FIG. 18, the slots 110 are arranged in the pair of waveguides 101a and 101b such that the slots are located on the left and right sides of the central line when the waveguides are seen in a superimposed state.

The arrows in FIG. 18 indicate electric currents flowing in the waveguide walls. A microwave exists as a standing wave in a propagation space defined by the distance in the longitudinal direction of the waveguides 101a and 101b. Owing to this standing wave, the currents in the waveguide walls also take the form of a standing wave. However, the form of the standing wave of a microwave is three-dimensional and complicated. So, it is convenient to consider only the electric field of a transient progressive wave (or reflected wave).

That is, when the upper and lower slots at the same positions in the longitudinal direction of the waveguides are taken into consideration, the directions of currents flowing in the waveguides indicated by the arrows in FIG. 18 are the same (the direction indicated by an arrow 100). Also, the current directions are the same between the slots 110 of the waveguides 101a and 101b. According to this arrangement, therefore, microwaves emitted from all the slots 110 of the waveguides 101a and 101b are in phase with each other, so their standing waves do not cancel out each other.

In this modification, therefore, with a simpler arrangement than that of the above embodiment, microwaves are uniformly radiated in phase with each other from the upper and lower slots 110. This realizes uniform plasma discharge over the length of the laser tube 102.

As described above, the excimer laser oscillators of this embodiment and its modification employ a slot array structure and yet realize uniform electromagnetic wave radiation over the length of a laser tube and allow uniform laser emission with minimum energy loss.

Note that the second embodiment is generally based on the assumption that the three-dimensional circuit from the waveguide resonator end to the microwave power supply is symmetrical in terms of a microwave. If this three-dimensional circuit is asymmetrical, phase shift or the like for compensating for this asymmetry is naturally required.

In the above embodiments, the phases of electromagnetic waves emitted through all the slots are made coherent by arranging the slots at a predetermined pitch along a central line in the longitudinal direction of the long end face (H plane) of the waveguide to be alternately located on the left and right sides of the central line, or arranging a pair of waveguides having these slots such that the H planes of the pair of waveguides vertically sandwich the laser tube.

Other arrangements are also applicable. For example, the slots may be arranged symmetrically to the central line in the longitudinal direction of the long end face (H plane) of the waveguide at a predetermined pitch along the central line. Further, at least one slot antenna including an elongate slit may be employed instead of the plurality of slots.

Third Embodiment

Figure 19:
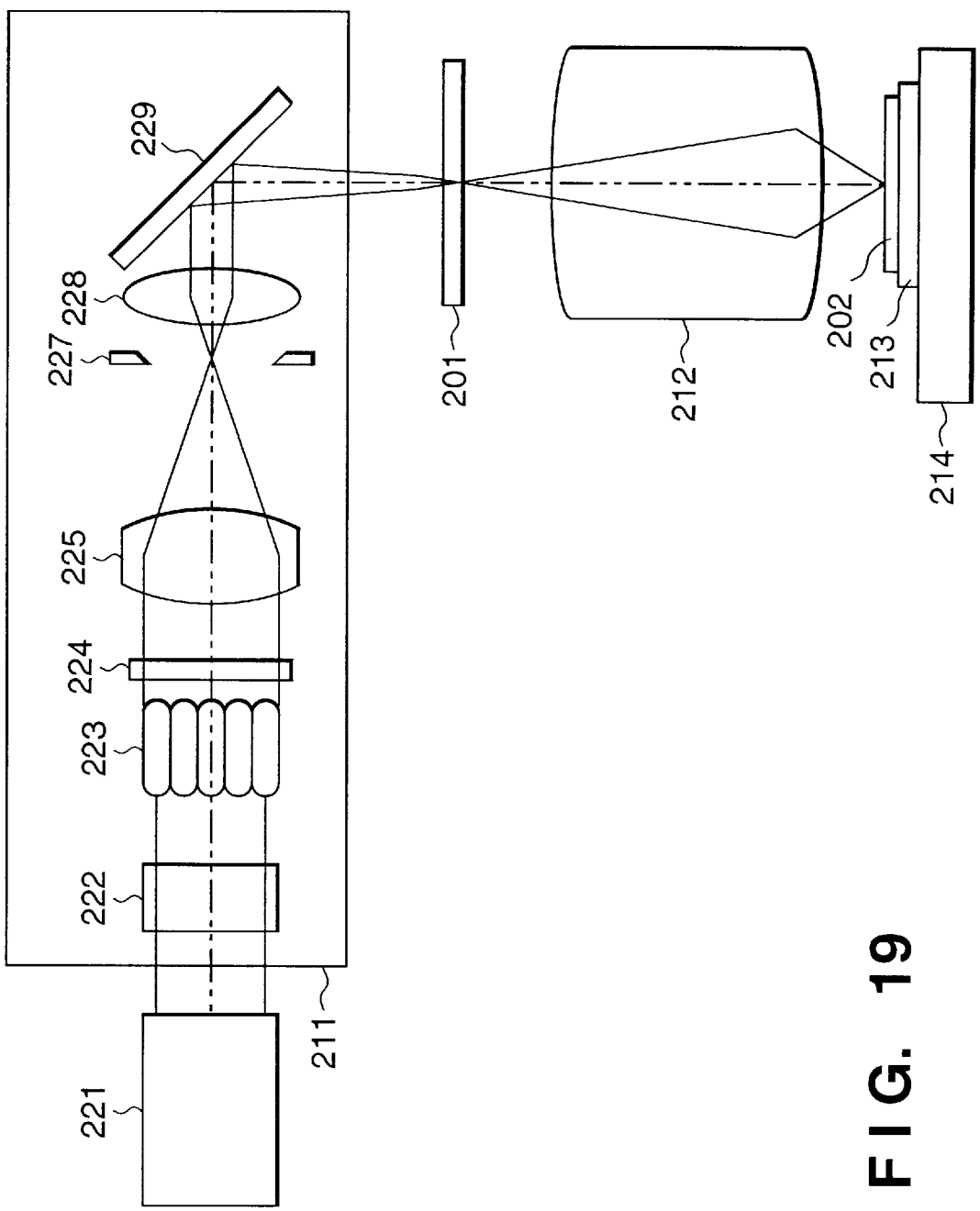
FIG. 19 is a schematic view showing a stepper according to the third embodiment of the present invention.

The third embodiment will be described below. In the third embodiment, an exposure apparatus (e.g., a stepper) having the excimer laser oscillator described in any of the second embodiment as a laser source will be explained. FIG. 19 is a schematic view showing the main components of this stepper.

This stepper comprises an illumination optical system 211, projecting optical system 212, wafer chuck 213, and wafer stage 214. The illumination optical system 211 irradiates a reticle 201 on which a desired pattern is drawn with illuminating light. The projecting optical system 212 projects the illuminating light (the pattern of the reticle 201) passing through the reticle 201 onto the surface of a wafer 202 in a reduced scale. The wafer chuck 213 mounts and fixes the wafer 202. The wafer stage 214 fixes the wafer chuck 213.

Note that not only a transmission type reticle (reticle 201) shown in FIG. 19 but also a reflection type reticle can be used as a reticle.

The illumination optical system 211 includes an excimer laser oscillator 221 of the first embodiment, beam shape converter 222, optical integrator 223, stop member 224, condenser lens 225, blind 227, image forming lens 228, and reflecting mirror 229. The excimer laser oscillator 221 is a light source for emitting a high-luminance excimer laser beam as illuminating light. The beam shape converter 222 converts the illuminating light from the light source 221 into a beam having a desired sectional shape. The optical integrator 223 is formed by two-dimensionally arranging a plurality of cylindrical lenses or microlenses. The stop member 224 is placed near the position of secondary sources formed by the optical integrator 223 and can be switched to an arbitrary aperture value by a switching mechanism (not shown). The condenser lens 225 condenses the illuminating light passing through the stop member 224. The blind 227 is constructed of, e.g., four variable blades and placed on the conjugate plane of the reticle 201 to determine an arbitrary illuminating range on the surface of the reticle 201. The image forming lens 228 projects the illuminating light formed into a predetermined shape by the blind 227 onto the surface of the reticle 201. The reflecting mirror 229 reflects the illuminating light from the image forming lens 228 toward the reticle 201.

An operation of projecting the pattern on the reticle 201 onto the surface of the wafer 202 in a reduced scale by using the stepper constructed as above will be described below.

First, the illuminating light emitted from the light source 221 is converted into a predetermined shape by the beam shape converter 222 and directed to the optical integrator 223. Consequently, a plurality of secondary sources are formed near the exit surface of the optical integrator 223. Illuminating light from these secondary sources is condensed by the condenser lens 225 via the stop member 224 and formed into a predetermined shape by the blind 227. After that, the illuminating light is reflected by the reflecting mirror 229 via the image forming lens 228 and enters the reticle 201. Subsequently, the illuminating light enters the surface of the wafer 202 through the pattern of the reticle 201 and the projection optical system 222. As a consequence, the pattern of the reticle 201 is projected on the wafer 202 in a reduced scale, and the wafer 202 is exposed.

The exposure apparatus of this embodiment uses the excimer laser oscillator of the first or second embodiment as a laser source. This apparatus can therefore use a high-output and uniform excimer laser beam that can be sustained for a relatively long time period. This allows rapid exposure of the wafer 202 with an accurate exposure amount.

Next, a semiconductor device fabrication method using the projecting exposure apparatus explained with reference to FIG. 19 will be described below.

Figure 20:
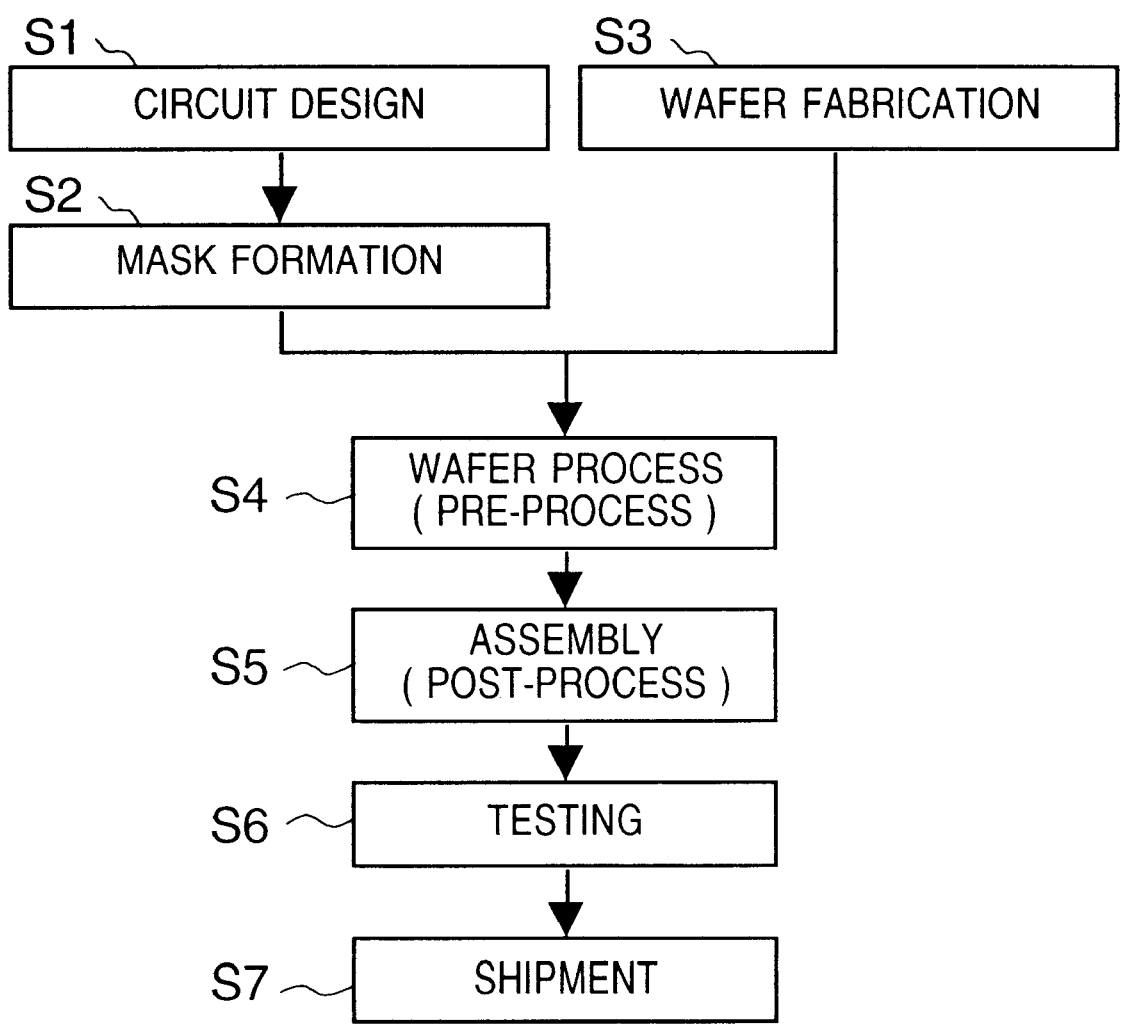
FIG. 20 is a flow chart showing the steps in manufacturing a semiconductor device by using the stepper according to the third embodiment of the present invention.

FIG. 20 shows the flow of fabrication steps of semiconductor devices (e.g., semiconductor chips such as ICs and LSIs, liquid crystal panels, or CCDs). First, in step 1 (circuit design), circuits of semiconductor devices are designed. In step 2 (mask formation), a mask having the designed circuit patterns is formed. In step 3 (wafer fabrication), wafers are fabricated by using materials such as silicon. Step 4 (wafer process) is called a pre-process in which actual circuits are formed on the wafers by the photolithography technique by using the mask and wafers prepared as above. Step 5 (assembly) is called a post-process in which semiconductor chips are formed from the wafers formed in step 4. This process includes steps such as an assembly step (dicing and bonding) and a packaging step (chip encapsulation). In step 6 (testing), tests such as an operation test and a durability test are conducted on the semiconductor devices fabricated in step 5. The semiconductor devices are completed through these steps and shipped (step 7).

Figure 21:
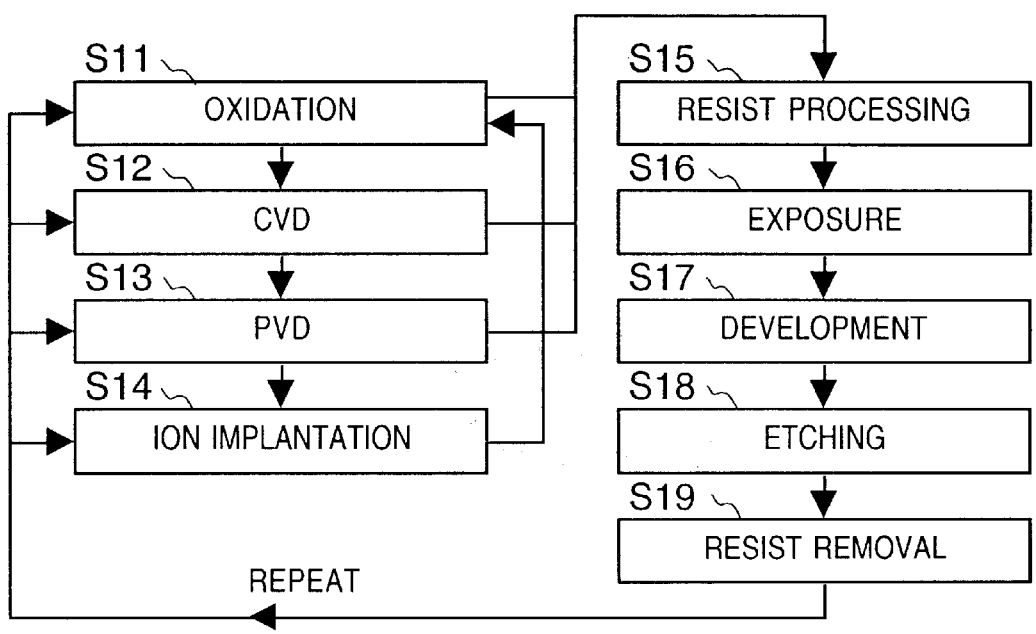
FIG. 21 is a flow chart showing the details of a wafer process in FIG. 20.
Figure 22:
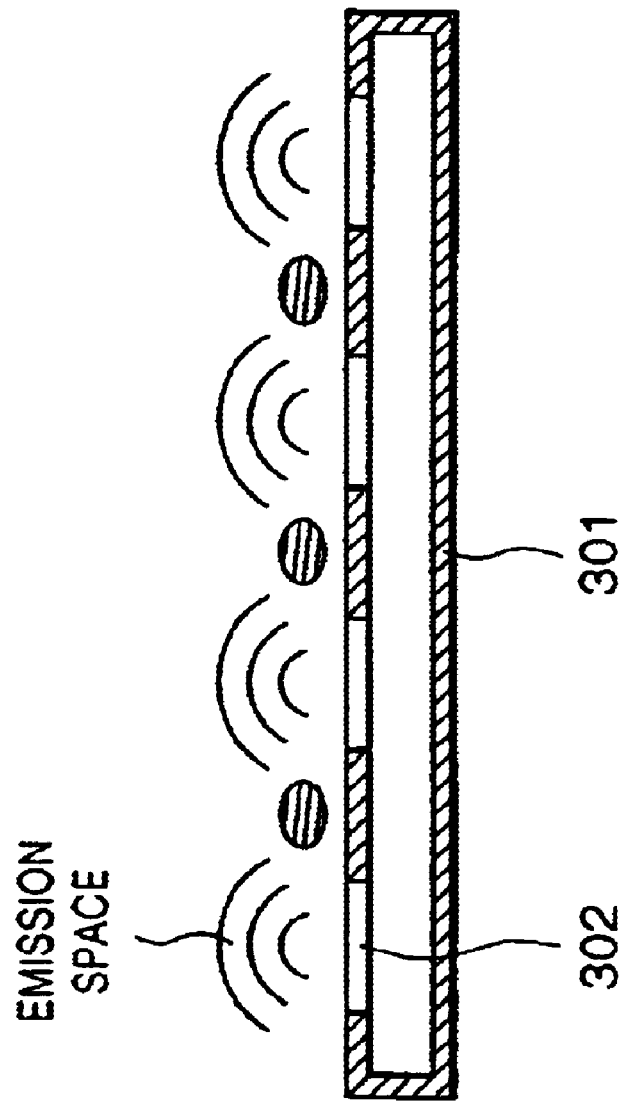
FIG. 22 is a schematic sectional view the details of a conventional waveguide.

FIG. 21 shows a detailed flow of the wafer process described above. In step 11 (oxidation), the surfaces of the wafers are oxidized. In step 12 (CVD), conductive films and insulating films are formed on the wafer surfaces by using vapor phase reaction. In step 13 (PVD), conductive films and insulating films are formed on the wafers by sputtering or vapor deposition. In step 14 (ion implantation), ions are implanted into the wafers. In step 15 (resist processing), the wafers are coated with a photosensitive agent. In step 16 (exposure), the projecting exposure apparatus explained above is used to expose the wafers to the circuit patterns of the mask. In step 17 (development), the exposed wafers are developed. In step 18 (etching), portions except for the developed resist image are etched away. In step 19 (resist removal), the unnecessary resist after the etching is removed. Multiple circuit patterns are formed on the wafers by repeating these steps.

This fabrication method can easily and reliably fabricate, with high yield, highly integrated semiconductor devices which are conventionally difficult to fabricate.

According to the present invention, in the slot array structure, electromagnetic wave emission that is uniform as a whole over the length of the laser tube can be realized, and hence uniform laser emission with minimum energy loss can be performed.

The present invention is not limited to the above embodiments and various changes and modifications can be made within the spirit and scope of the present invention. Therefore, to apprise the public of the scope of the present invention, the following claims are made.

What is claimed is:

1. A laser oscillating apparatus for generating a laser beam by introducing electromagnetic waves into a laser tube filled with a laser gas through a plurality of slots formed in a waveguide wall, wherein said plurality of slots are formed in a long end face of said waveguide and arranged in first and second lines parallel with a central line in a longitudinal direction of the long end face, the slots in the first line are located at an interval equal to a wavelength of the electromagnetic waves within said waveguide, the slots in the second line are located at the interval equal to the wavelength, and positions of the slots in the first line are shifted by one half of the wavelength from positions of the slots in the second line in a direction parallel with the central line, thereby in-phase electromagnetic waves are supplied to said laser tube through said plurality of slots.

2. The apparatus according to claim 1, wherein the long end face in which said plurality of slots are formed and said laser tube are spaced apart from each other by a predetermined distance, and said laser oscillating apparatus further comprises a passage connecting said tube and said plurality of slots, wherein said passage guides electromagnetic waves from said plurality of slots to said laser tube.

3. The apparatus according to claim 2, wherein the distance between the long end face in which said plurality of slots are formed and said laser tube is an integral multiple of a half-wavelength of an electromagnetic wave provided from said waveguide to said laser tube.

4. The apparatus according to claim 2, wherein a width of said passage is substantially equal to a width of the slot.

5. The apparatus according to claim 2, wherein a width of said passage is an integral multiple of a half-wavelength of an electromagnetic wave supplied from said waveguide to said laser tube.

6. The apparatus according to claim 2, wherein a portion through which said passage communicates with said laser tube has a slit portion having a predetermined width and extending over a length of said laser tube.

7. The apparatus according to claim 2, wherein a portion through which said passage communicates with said laser tube has a plurality of lines of slit portions extending over a length of said laser tube.

8. The apparatus according to claim 2, wherein a portion through which said passage communicates with said waveguide has a width larger than a width of a portion through which said passage communicates with said laser tube.

9. The apparatus according to claim 2, wherein said passage is filled with a dielectric substance.

10. The apparatus according to claim 1, wherein said waveguide is filled with a dielectric substance.

11. The apparatus according to claim 1, wherein said plurality of slots are filled with a dielectric substance.

12. The apparatus according to claim 11, wherein said plurality of slots are filled with said dielectric substance such that a surface in which said plurality of slots are formed is flattened.

13. The apparatus according to claim 1, wherein a pair of said waveguides are arranged to sandwich said laser tube.

14. The apparatus according to claim 1, further comprising an adjustable metal member, the adjustment of which effects an impedance of said plurality of slots.

15. The apparatus according to claim 14, wherein said adjustable metal member includes a minute metal member attached to the short end face of said waveguide.

16. The apparatus according to claim 1, wherein the electromagnetic wave supplied from said waveguide to said laser tube is a microwave.

17. The apparatus according to claim 1, wherein the laser gas is one of at least one type of gas selected from the group consisting of Kr, Ar, Ne, and He, and a gas mixture of the one type of gas and $F_2$ gas, and said apparatus comprises an excimer laser oscillating apparatus.

18. A laser oscillating apparatus for generating a laser beam by introducing electromagnetic waves into a laser tube filled with a laser gas, said apparatus comprising:

a pair of waveguides sandwiching said laser tube, a plurality of slots being formed in a long end face of each of said pair of waveguides and arranged in first and second lines parallel with a central line in a longitudinal direction of the long end face, wherein the slots in the first line are located at an interval equal to a wavelength of the electromagnetic waves within said waveguide, the slots in the second line are located at the interval equal to the wavelength, and positions of the slots in the first line are shifted by one half of the wavelength from positions of the slots in the second line in a direction parallel with the central line, thereby in-phase electromagnetic waves are supplied to said laser tube through said plurality of slots of said pair of waveguides.

19. The apparatus according to claim 18, wherein positions of said plurality of slots formed in one waveguide in a longitudinal direction of said laser tube are shifted from positions of plurality of slots formed in said other waveguide in the longitudinal direction of said laser tube by a predetermined distance.

20. The apparatus according to claim 18, wherein said laser oscillating apparatus further comprises electromagnetic wave supplying means for supplying electromagnetic waves with a predetermined phase difference to each of said pair of waveguides.

21. The apparatus according to claim 18, further comprising tuning means for tuning electromagnetic waves to said pair of waveguides.

22. The apparatus according to claim 18, further comprising phase shifting means for relatively shifting a phase of electromagnetic waves in said pair of waveguides.

23. The apparatus according to claim 18, wherein the electromagnetic wave supplied from said waveguide to said laser tube is a microwave.

24. The apparatus according to claim 18, wherein the laser gas is one of at least one type of gas selected from the group consisting of Kr, Ar, Ne, and He, and a gas mixture of the one type of gas and $F_2$ gas, and said apparatus comprises an excimer laser oscillating apparatus.

25. An exposure apparatus comprising a laser oscillating unit, an illumination optical system which generates illuminating light for irradiating a mask with a laser beam supplied from said laser oscillating unit, and a projection optical system which projects a pattern of the mask illuminated with the illuminating light generated by said optical system onto a substrate, wherein said laser oscillating unit generates the laser beam by introducing electromagnetic waves into a laser tube filled with a laser gas through a plurality of slots formed in a waveguide wall, said plurality of slots are formed in a long end face of said waveguide and arranged in first and second lines parallel with a central line in a longitudinal direction of the long end face, the slots in the first line are located at an interval equal to a wavelength of the electromagnetic waves within said waveguide, the slots in the second line are located at the interval equal to the wavelength, and positions of the slots in the first line are shifted by one half of the wavelength from positions of the slots in the second line in a direction parallel with the central line, thereby in-phase electromagnetic waves are supplied to said laser tube through said plurality of slots.

26. An exposure apparatus comprising a laser oscillating unit, an illumination optical system which generates illuminating light for irradiating a mask with a laser beam supplied from said laser oscillating unit, and a projection optical system which projects a pattern of the mask illuminated with the illuminating light generated by said optical system onto a substrate, wherein said laser oscillating unit generates the laser beam by introducing electromagnetic waves into a laser tube filled with a laser gas, and said laser oscillating unit comprises:

a pair of waveguides sandwiching said laser tube, a plurality of slots being formed in a long end face of each of said pair of waveguides and arranged in first and second lines parallel with a central line in a longitudinal direction of the long end face, the slots in the first line are located at an interval equal to a wavelength of the electromagnetic waves within said waveguide, the slots in the second line are located at the interval equal to the wavelength, and positions of the slots in the first line are shifted by one half of the wavelength from positions of the slots in the second line in a direction parallel with the central line, thereby in-phase electromagnetic waves are supplied to said laser tube through said plurality of slots of said pair of waveguides.

27. A laser oscillating method comprising the steps of:

filling a laser tube with a laser gas; and generating a laser beam by introducing electromagnetic waves into the laser tube through a plurality of slots formed in a waveguide wall, wherein the plurality of slots are formed in a long end face of the waveguide and arranged in first and second lines parallel with a central line in a longitudinal direction of the long end face, the slots in the first line are located at an interval equal to a wavelength of the electromagnetic waves within the waveguide, the slots in the second line are located at the interval equal to the wavelength, and positions of the slots in the first line are shifted by one half of the wavelength from positions of the slots in the second line a direction parallel with the central line, thereby in-phase electromagnetic waves are supplied to the laser tube through the plurality of slots.

28. A laser oscillating method comprising the steps of:

filling a laser tube with a laser gas; and generating a laser beam by introducing electromagnetic waves into the laser tube from a pair of waveguides sandwiching the laser tube, wherein a plurality of slots are formed in a long end face of each of the pair of waveguides and arranged in first and second lines parallel with a central line in a longitudinal direction of the long end face, the slots in the first line are located at an interval equal to a wavelength of the electromagnetic waves within said waveguide, the slots in the second line are located at the interval equal to the wavelength, and positions of the slots in the first line are shifted by one half of the wavelength from positions of the slots in the second line in a direction parallel with the central line, thereby in-phase electromagnetic waves are supplied to the laser tube through the plurality of slots of the pair of waveguides.

29. A laser oscillating method according to claim 27, wherein the laser is an excimer laser.

30. A laser oscillating method according to claim 28, wherein the laser is an excimer laser.

* * * * *

UNITED STATES PATENT AND TRADEMARK OFFICE
CERTIFICATE OF CORRECTION

PATENT NO. : 6,744,802 B1
DATED : June 1, 2004
INVENTOR(S) : Tadahiro Ohmi et al.

It is certified that error appears in the above-identified patent and that said Letters Patent is hereby corrected as shown below:

<u>Title page,</u>
Item [56], References Cited, U.S. PATENT DOCUMENTS
"Kruger et al." should read -- Krüger et al. --.

<u>Column 1,</u>
Line 23, "of" (first occurrence) should be deleted.

<u>Column 2,</u>
Line 14, "and" should be deleted.

<u>Column 5,</u>
Line 22, "waveguide" should read -- waveguides --.

<u>Column 7,</u>
Line 6, "$F^2$ gas" should read -- $F_2$ gas --.

<u>Column 9,</u>
Line 3, "$\mu g/2$" should read -- $\lambda g/2$ -- .
Line 6, "the these" should read -- these --.

<u>Column 10,</u>
Line 8, "wet" should read -- set --.
Line 58, "$\mu g/2$" should read -- $\lambda g/2$ -- .

<u>Column 12,</u>
Line 36, "electric field $\epsilon$" should read -- electric field E --.

<u>Column 13,</u>
Line 1, "$F^2$ gas." should read -- $F_2$ gas. --.
Line 6, "$F^2$" should read -- $F_2$ --.
Line 34, "$\epsilon$ plane." should read -- E plane.--

<u>Column 14,</u>
Line 8, "$d=\mu g/2$" should read -- $d=\lambda g/2$ --.
Line 13, "$d=\mu g/2$" should read -- $d=\lambda g/2$ -- and "$\theta=\pi(\lambda g/2$ shift $+\mu g/2$ shifter)" should read -- $\theta=\pi(\lambda g/2$ shift $+\lambda g/2$ shifter) --.
Line 21, "$\epsilon$ plane" should read -- E plane --.
Line 27, "$\epsilon$ plane" should read -- E plane --.
Line 49, "not space" should read -- no space --.

UNITED STATES PATENT AND TRADEMARK OFFICE
CERTIFICATE OF CORRECTION

PATENT NO. : 6,744,802 B1
DATED : June 1, 2004
INVENTOR(S) : Tadahiro Ohmi et al.

It is certified that error appears in the above-identified patent and that said Letters Patent is hereby corrected as shown below:

Column 15,
Line 35, "10b." should read -- 101b. --.
Line 38, "numerals 114" should read -- numeral 114 --.

Column 16,
Table 4, "λg/2 shift + λg/2 shift slots" should read -- λg/2 shift + λg/2 shifter slots --.

Column 18,
Line 11, "elongate" should read -- elongated --.
Line 18, "embodiment" should read -- embodiments --.

Column 20,
Line 4, "face," should read -- face, and --.

Column 21,
Line 56, "face," should read -- face, and --.

Column 22,
Line 14, "face," should read -- face, and --.
Line 33, "face," should read -- face, and --.
Line 40, "line a" should read -- line in a --.
Line 51, "face," should read -- face, and --.

Signed and Sealed this

Eighteenth Day of January, 2005

JON W. DUDAS
*Director of the United States Patent and Trademark Office*